US012590669B2

(12) United States Patent
Park et al.

(10) Patent No.: US 12,590,669 B2
(45) Date of Patent: Mar. 31, 2026

(54) DISPLAY DEVICE INCLUDING CHAIN UNITS AND DRIVING SPROCKETS

(71) Applicant: LG Display Co., Ltd., Seoul (KR)

(72) Inventors: GeunChang Park, Goyang-si (KR);
ChounSung Kang, Gimpo-si (KR);
Daeyun Kim, Seoul (KR)

(73) Assignee: LG Display Co., Ltd (KR)

( * ) Notice: Subject to any disclaimer, the term of this patent is extended or adjusted under 35 U.S.C. 154(b) by 164 days.

(21) Appl. No.: 18/533,324

(22) Filed: Dec. 8, 2023

(65) Prior Publication Data
US 2024/0218956 A1 Jul. 4, 2024

(30) Foreign Application Priority Data

Dec. 29, 2022 (KR) ........................ 10-2022-0188731

(51) Int. Cl.
G06F 1/16 (2006.01)
F16M 11/04 (2006.01)
*G02F 1/1333* (2006.01)
*H10K 77/10* (2023.01)

(52) U.S. Cl.
CPC ..... F16M 11/046 (2013.01); *F16M 2200/047* (2013.01); *G02F 1/133305* (2013.01); *G02F 1/133308* (2013.01); *G06F 1/1652* (2013.01); *H10K 77/111* (2023.02)

(58) Field of Classification Search
CPC ...... G06F 1/1641; G06F 1/1652; G06F 9/301; F16G 13/20; F16M 11/046; F16M 2200/047
See application file for complete search history.

(56) References Cited

U.S. PATENT DOCUMENTS

| | | | | |
|---|---|---|---|---|
| 5,271,182 A | * | 12/1993 | Greisner | E05F 15/619 |
| | | | | 49/325 |
| 2004/0220004 A1 | * | 11/2004 | Bourc'His | B66F 3/06 |
| | | | | 474/152 |
| 2013/0312554 A1 | * | 11/2013 | Saji | F16G 13/20 |
| | | | | 74/89.21 |
| 2016/0187929 A1 | * | 6/2016 | Kim | G06F 1/1643 |
| | | | | 345/184 |
| 2016/0324021 A1 | * | 11/2016 | Takayanagi | G06F 1/1652 |
| 2020/0201394 A1 | * | 6/2020 | Choi | G09F 9/301 |
| 2021/0045258 A1 | * | 2/2021 | Lee | G06F 1/1601 |
| 2021/0127512 A1 | * | 4/2021 | Lee | G06F 1/1601 |
| 2021/0158727 A1 | * | 5/2021 | Choi | F16M 11/046 |
| 2021/0183275 A1 | * | 6/2021 | Han | G09F 9/301 |
| 2022/0210958 A1 | * | 6/2022 | Yoon | H05K 9/0054 |

(Continued)

FOREIGN PATENT DOCUMENTS

| | | |
|---|---|---|
| KR | 10-2016-0129668 A | 11/2016 |
| KR | 10-2021-0017058 A | 2/2021 |

*Primary Examiner* — Abhishek M Rathod
(74) *Attorney, Agent, or Firm* — Fish & Richardson P.C.

(57) ABSTRACT

A display device includes a display panel, a roller around which the display panel is wound or from which the display panel is unwound, a first spring disposed in the roller, a plurality of chain units connected to the display panel and configured to move the display panel in an upward/downward direction, a plurality of driving sprockets disposed to engage with the plurality of chain units and configured to move the plurality of chain units, and a plurality of second springs connected to the plurality of driving sprockets.

21 Claims, 19 Drawing Sheets

(56) References Cited

U.S. PATENT DOCUMENTS

2023/0118041 A1\*   4/2023   Lu ........................... B65G 19/20
                                                198/810.04
2023/0209747 A1\*   6/2023   Jeon .................. G02F 1/133308
2023/0337378 A1\*   10/2023   Pyo ........................ G09F 9/301

\* cited by examiner

MP(150,160)
160(161,163,164)

DISPLAY DEVICE INCLUDING CHAIN UNITS AND DRIVING SPROCKETS

CROSS-REFERENCE TO RELATED APPLICATION

This application claims the priority of Korean Patent Application No. 10-2022-0188731 filed on Dec. 29, 2022, which is hereby incorporated by reference in its entirety.

BACKGROUND

Field of the Disclosure

The present disclosure relates to a display device, and more particularly, to a rollable display device capable of displaying images even in a case in which the display device is rolled up.

Description of the Background

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, a rollable display device, which is made by forming display parts, lines, and the like on a substrate made of a flexible plastic material having flexibility and thus may display images even in a case in which the rollable display device is rolled up, has attracted attention as a next-generation display device.

SUMMARY

The present disclosure is to provide a display device capable of being manually wound and unwound.

In addition, the present disclosure is to provide a display device capable of stably moving a display panel upward or downward by using a zipper-type chain unit.

Further, the present disclosure is to provide a display device with improved user convenience.

The present disclosure is not limited to the above-mentioned and other features, which are not mentioned above, may be clearly understood by those skilled in the art from the following descriptions.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes: a display panel; a roller around which the display panel is wound or from which the display panel is unwound; a first spring disposed in the roller; a plurality of chain units connected to the display panel and configured to move the display panel in an upward/downward direction; a plurality of driving sprockets disposed to engage with the plurality of chain units and configured to move the plurality of chain units; and a plurality of second springs connected to the plurality of driving sprockets.

Other detailed matters of the exemplary aspects are included in the detailed description and the drawings.

The present disclosure may improve the reliability of the display device by coping with swaying of the lifting unit.

The present disclosure may improve durability and stably move the display panel upward by using the zipper-type chain unit.

The present disclosure may improve user convenience at the time of winding and unwinding the display panel by equilibrium between a force of the spring disposed inside the roller and a force of the spring disposed outside the roller.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
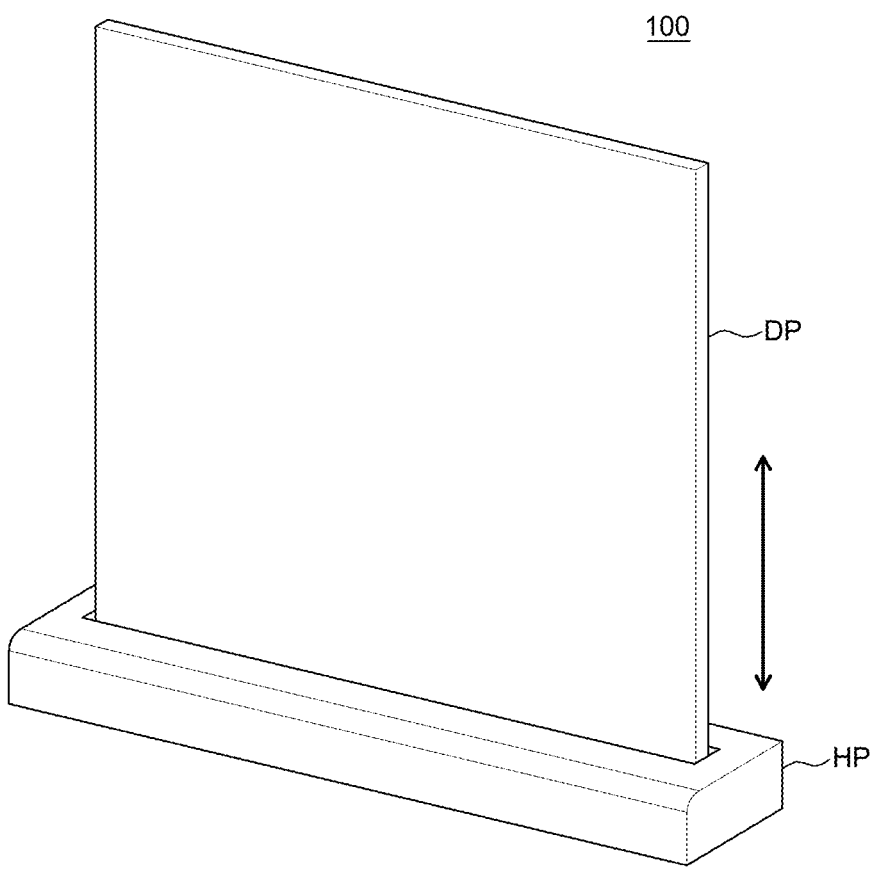
FIGS. 1A and 1B are perspective views of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, various exemplary aspects of the present disclosure will be described in detail with reference to the accompanying drawings.

<Display Device—Rollable Display Device>

A rollable display device refers to a display device capable of displaying images even in a case in which the rollable display device is rolled up. The rollable display device may have higher flexibility than a general display device in the related art. A shape of the rollable display device may be freely changed depending on whether the rollable display device is used. Specifically, when the rollable display device is not used, the rollable display device may be rolled up and stored with a reduced volume. On the contrary, when the rollable display device is used, the rolled-up rollable display device may be unrolled again and used.

Figure 1B:
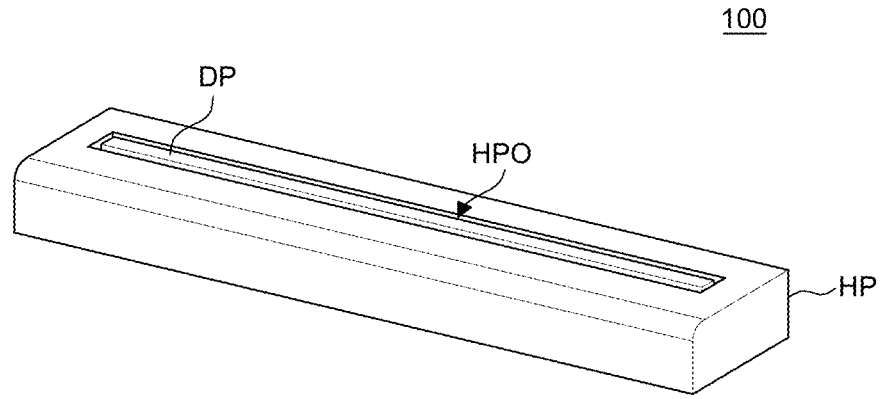
Figure 2:
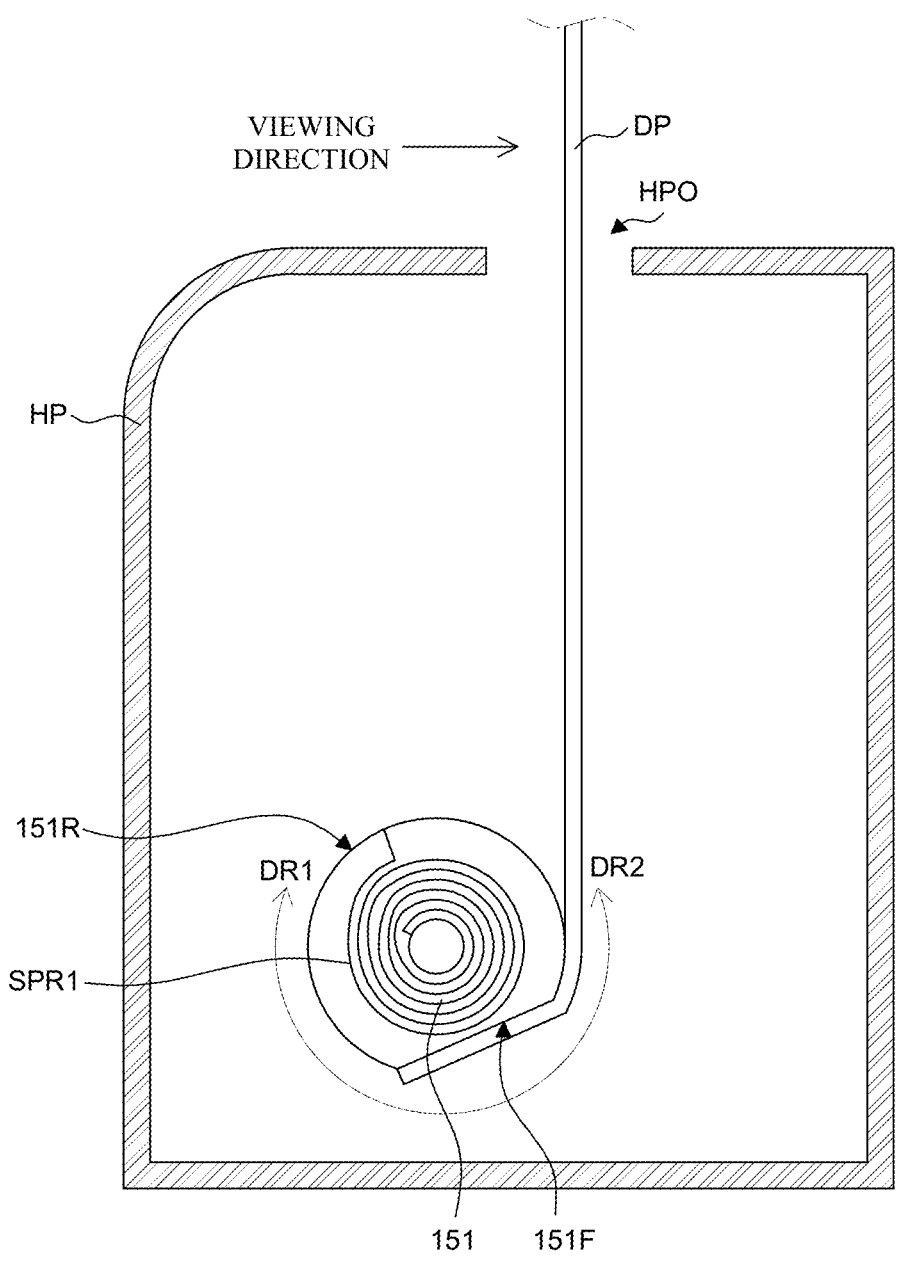
FIG. 2 is a schematic cross-sectional view of the display device according to the exemplary aspect of the present disclosure.

FIGS. 1A and 1B are perspective views of a display device according to an exemplary aspect of the present disclosure. FIG. 2 is a schematic cross-sectional view of the display device according to the exemplary aspect of the present disclosure.

With reference to FIGS. 1A and 1B, a display device 100 according to an exemplary aspect of the present disclosure includes a display part DP and a housing part HP.

The display part DP is configured to display images to a user. For example, display elements and circuits, lines, and components for operating the display elements may be disposed on the display part DP. In this case, because the display device 100 according to the exemplary aspect of the present disclosure is a rollable display device 100, the display part DP may be configured to be wound or unwound. For example, the display part DP may include a display panel having flexibility to be wound or unwound, and a back cover. The display part DP will be described below in more detail with reference to FIGS. 3A and 4B.

The housing part HP is a casing capable of accommodating the display part DP. The display part DP may be wound and accommodated in the housing part HP. The display part DP may be unwound and disposed outside the housing part HP.

The housing part HP has an opening portion HPO through which the display part DP may move to the outside or the inside of the housing part HP. The display part DP may move in an upward/downward direction while passing through the opening portion HPO of the housing part HP.

Meanwhile, the display part DP of the display device 100 may switch from a fully unwound state to a fully wound state or switch from the fully wound state to the fully unwound state.

FIG. 1A illustrates that the display part DP of the display device 100 is in the fully unwound state. The fully unwound state is a state in which the display part DP of the display device 100 is disposed outside the housing part HP. That is, the fully unwound state may be defined as a state in which the display part DP is maximally unwound and disposed outside the housing part HP and cannot be unwound any further to allow a user to see the image on the display device 100.

FIG. 1B illustrates that the display part DP of the display device 100 is in the fully wound state. The fully wound state is a state in which the display part DP of the display device 100 is accommodated in the housing part HP and cannot be wound any further. That is, the configuration in which the display part DP is not disposed outside the housing part HP is advantageous in terms of an external appearance when the user does not see the image on the display device 100. Therefore, the fully wound state may be defined as a state in which the display part DP is wound and accommodated in the housing part HP. In addition, in the fully wound state in which the display part DP is accommodated in the housing part HP, the volume of the display device 100 decreases, and the display device 100 may be easy to transport.

In addition, the display part DP of the display device 100 may switch from the fully wound state to a partially unwound state. The state in which the display part DP is partially unwound may be defined as a state in which a part of the display part DP is disposed outside the housing part HP.

With reference to FIG. 2, the display part DP may be switched to a fully unwound state, a fully wound state, or a partially unwound state by a drive part MP and a roller 151. For convenience of description, FIG. 2 illustrates only the housing part HP, the display part DP, and the roller 151.

The roller 151 may be accommodated in the housing part HP and wind or unwind the display part DP. Specifically, the roller 151 may be accommodated in the housing part HP and fix a lower edge of the display part DP. The roller 151 may rotate clockwise or counterclockwise to wind the display part DP. For example, when the roller 151 rotates in a first direction DR1, i.e., clockwise, the display part DP may be wound so that a front surface of the display part DP is in close contact with a surface of the roller 151. Further, when the roller 151 rotates in a second direction DR2, i.e., counterclockwise, the display part DP wound around the roller 151 may be unwound from the roller 151 and disposed outside the housing part HP.

The roller 151 may have a cylindrical shape in which at least a portion of an outer peripheral surface of the roller 151 has a flat surface, and the remaining portion of the outer peripheral surface has a curved surface. The roller 151 may have a cylindrical shape as a whole, but a part of the roller 151 may have a flat surface. That is, a portion of the outer peripheral surface of the roller 151 is flat, and the remaining portion of the outer peripheral surface is curved. For example, the roller 151 may include a curved surface portion 151R and a flat surface portion 151F. The flat surface portion 151F of the roller 151 may be a portion on which a plurality of flexible films and a printed circuit board of the display part DP are seated. However, the roller 151 may have a complete cylindrical shape or any shape around which the display part DP may be wound. However, the present disclosure is not limited thereto.

In addition, the roller 151 may wind the display part DP by using an elastic force of a first spring SPR1.

Specifically, the first spring SPR1 may be disposed in the roller 151. When the roller 151 rotates in the second direction DR2 to unwind the display part DP, the first spring SPR1 is compressed. When the force for rotating the roller 151 in the second direction DR2 is eliminated, the first spring SPR1 rotates the roller 151 in the first direction DR1 to wind the display part DP around the roller 151. In this case, the display part DP unwound from the roller 151 may be kept in a flat state by using the elastic force of the first spring SPR1. The first spring SPR1 may be a spiral spring or a torsion spring. However, the present disclosure is not limited thereto. The first spring SPR1 will be described below in detail together with a second spring.

<Display Part>

Figure 3A:
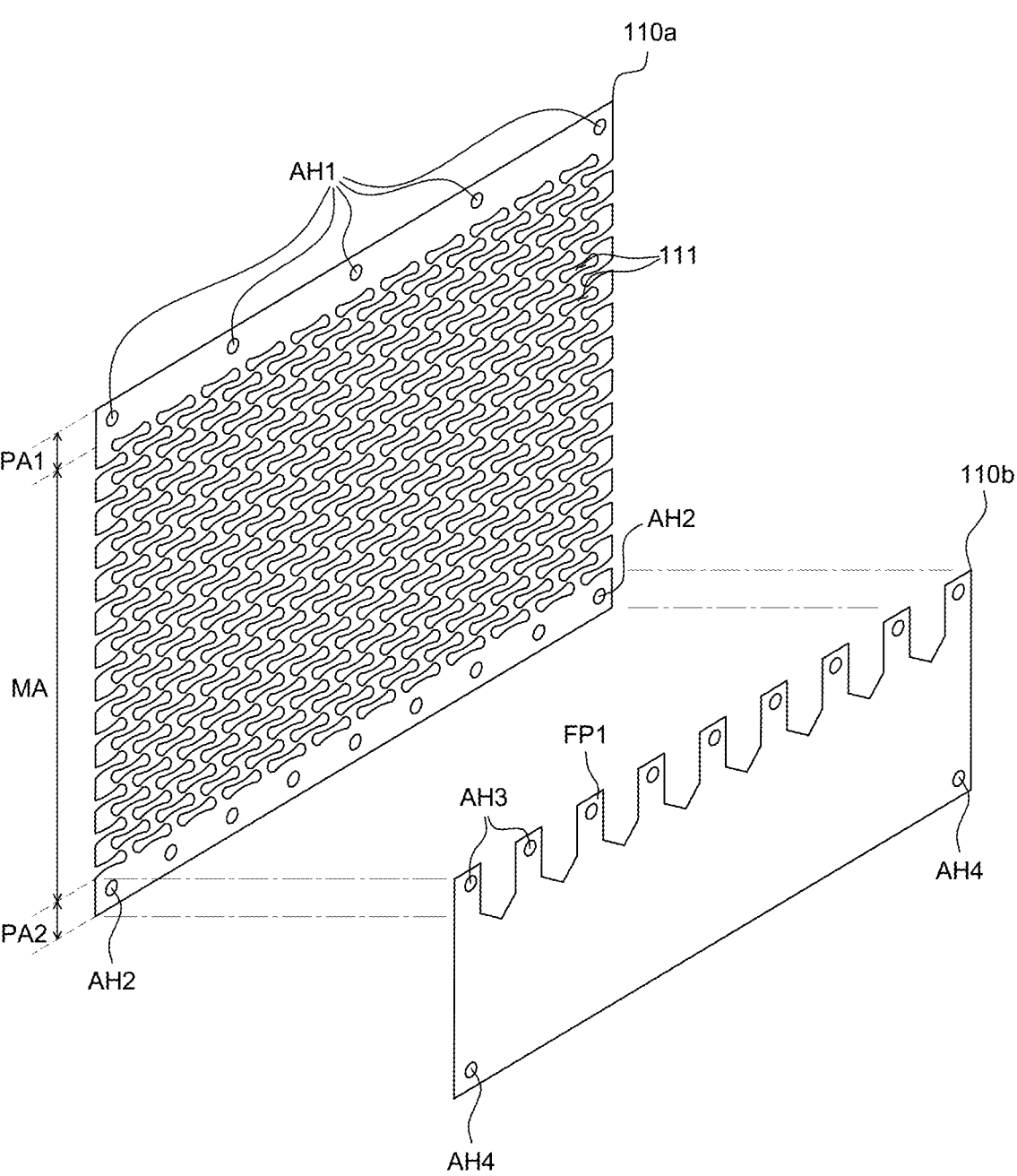
FIG. 3A is an exploded perspective view for explaining a first cover and a second cover of the display device according to the exemplary aspect of the present disclosure.
Figure 3B:
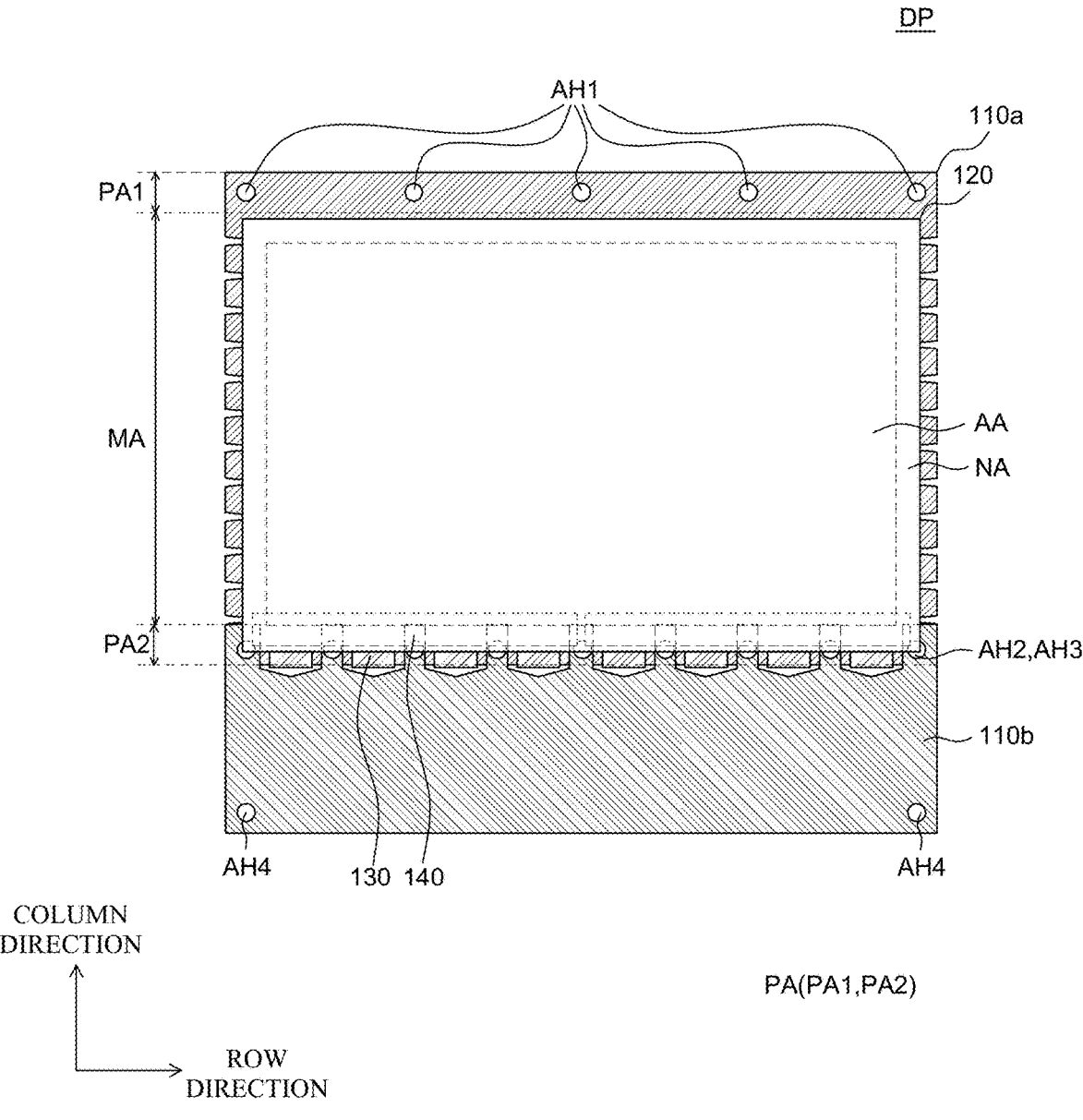
FIG. 3B is a top plan view of the display part of the display device according to the exemplary aspect of the present disclosure.

FIG. 3A is an exploded perspective view for explaining a first cover and a second cover of the display device according to the exemplary aspect of the present disclosure. FIG. 3B is a top plan view of the display part of the display device according to the exemplary aspect of the present disclosure.

With reference to FIGS. 3A and 3B, the display part DP includes a first cover 110a, a display panel 120, a plurality of flexible films 130, a printed circuit board 140, and a second cover 110b. However, the present disclosure is not limited thereto. The display part DP may include only the display panel 120, the plurality of flexible films 130, and the printed circuit board 140. For the convenience of description, a cover part is omitted in FIGS. 3A and 3B.

With reference to FIGS. 3A and 3B, the first cover 110a is disposed on the rear surface of the display panel 120 and supports the display panel 120. Because the first cover 110a is disposed on the rear surface of the display panel 120, the first cover 110a may be called a back cover. A size of the first cover 110a may be larger than a size of the display panel 120. The first cover 110a may protect other components of the display part DP from the outside.

The first cover 110a may be made of a material having rigidity. At least a part of the first cover 110a may have flexibility to be wound or unwound together with the display panel 120. For example, the first cover 110a may be made of a metallic material such as stainless steel (steel use stainless (SUS)) or Invar or a plastic material. However, the material of the first cover 110a may be variously changed in accordance with design as long as the material of the first cover 110a satisfies physical property conditions such as a thermal deformation amount, a radius of curvature, rigidity, and the like. However, the present disclosure is not limited thereto.

The first cover 110a may be fastened to a head bar 164 and the second cover 110b.

The first cover 110a includes a plurality of support areas PA and a ductile area MA. The plurality of support areas PA is areas in which a plurality of opening portions 111 is not disposed. The ductile area MA is an area in which the plurality of opening portions 111 is disposed. Specifically, the first cover 110a includes a first support area PA1, the ductile area MA, and a second support area PA2. The first support area PA1, the ductile area MA, and the second support area PA2 are sequentially disposed from the upper-most end of the first cover 110a. In this case, because the first cover 110a is wound or unwound in a column direction, the plurality of support areas PA and the ductile area MA may be disposed in the column direction.

The first support area PA1 of the first cover 110a is an uppermost end area of the first cover 110a fastened to the head bar to be described below. First fastening holes AH1 may be formed in the first support area PA1 so that the first support area PA1 is fastened to the head bar. For example, screws are disposed to penetrate the first fastening holes AH1 and the head bar, such that the head bar and the first support area PA1 may be fastened to each other. Further, the first support area PA1 is fastened to the head bar. Therefore, when a lifting unit, which is fastened to head bar and will be described below, moves upward or downward, the first cover 110a may also move upward or downward, and the display panel 120 attached to the first cover 110a may also move upward or downward. FIGS. 3A and 3B illustrate five first fastening holes AH1. However, the number of first fastening holes AH1 is not limited thereto. In addition, the configu-ration has been described in which the first cover 110a is fastened to the head bar by using the first fastening hole AH1. However, the present disclosure is not limited thereto. The first cover 110a and the head bar may be fastened to each other without a separate fastening hole.

The ductile area MA of the first cover 110a is an area extending downward from the first support area PA1 to the lower side of the first cover 110a. The ductile area MA is an area in which the plurality of opening portions 111 is disposed and to which the display panel 120 is attached. Specifically, the ductile area MA is an area that is wound or unwound around the roller 151 together with the display panel 120. The ductile area MA may overlap with at least the display panel 120 among the other components of the display part DP.

The second support area PA2 of the first cover 110a is a lowermost area of the first cover 110a that extends from the ductile area MA. One end of the display panel 120 is disposed in the second support area PA2. For example, a pad area, which is a non-display area disposed at one end of the display panel 120, may be disposed in the second support area PA2.

With reference to FIG. 3A, second fastening holes AH2 are disposed in the second support area PA2. The second fastening holes AH2 may be holes for fixing the cover part, the second cover 110b, and the first cover 110a which will be described below. FIG. 3A illustrates nine second fasten-ing holes AH2. However, the number of second fastening holes AH2 is an example, and the present disclosure is not limited thereto.

Meanwhile, the plurality of opening portions 111, which is formed in the ductile area MA, is not formed in the first support area PA1 and the second support area PA2. Specifically, the first fastening holes AH1 are formed in the first support area PA1, and the second fastening holes AH2 are formed in the second support area PA2. However, the plurality of opening portions 111 formed in the ductile area MA is not formed in the first support area PA1 and the second support area PA2. In addition, the first and second fastening holes AH1 and AH2 are different in shape from the plurality of opening portions 111.

The first support area PA1 is an area fixed to the head bar. The second support area PA2 is an area that supports one end of the display panel 120, the plurality of flexible films 130, and the printed circuit board 140. The first and second support areas may have higher rigidity than the ductile area MA. Further, since the first and second support areas PA1 and PA2 have rigidity, the first and second support areas PA1 and PA2 may be securely fixed to the head bar 172 and the second cover 110b. The second support area PA2 may maintain the printed circuit board 140 and the pad area at one end of the display panel 120 in a flat shape, thereby protecting the printed circuit board 140 and the pad area of the display panel 120. Therefore, the display part DP may be fixed to the head bar 172 of the drive part MP and moved to the inside or outside of the housing part HP by the operation of the drive part MP. The second support area may protect the printed circuit board 140 and the pad area of one end of the display panel 120.

The plurality of opening portions 111 disposed in the ductile area MA of the first cover 110a may be deformed by stress applied to the display part DP while the display part DP is wound or unwound. Specifically, the ductile area MA of the first cover 110a may be deformed as the plurality of opening portions 111 contracts or expands while the display part DP is wound or unwound. Further, because the plurality of opening portions 111 contracts or expands, a slip of the display panel 120 disposed on the ductile area MA of the first cover 110a is minimized, such that stress to be applied to the display panel 120 may be minimized.

The second cover 110b may be fastened to the first cover 110a and the roller 151 and connect the first cover 110a and the roller 151. As described above, the second cover 110b may connect the first cover 110a and the roller 151 and finally connect the roller 151 and the display panel 120 disposed on the first cover 110a. However, the present disclosure is not limited thereto. The shape of the second cover 110b or the connection method may be variously changed in accordance with design as long as the second cover 110b may be connected to the first cover 110a and the roller 151. However, the present disclosure is not limited thereto.

One end of the second cover 110b is an uppermost end area of the second cover 110b and may overlap with one end of the first cover 110a. For example, one end of the second cover 110b may overlap with the second support area PA2. One end of the second cover 110b may be connected to and overlap with a part of the first cover 110a or connected to a part of the first cover 110a by using a connection member or the like. However, the present disclosure is not limited thereto.

The second cover 110b may include a plurality of first fastening parts FP1 that overlap with the first cover 110a. The plurality of first fastening parts FP1 is disposed at one end of the second cover 110b. In addition, a plurality of third fastening holes AH3 may be disposed in the plurality of first fastening parts FP1 to be fastened to the first cover 110a. The plurality of first fastening parts FP1 having the plurality of third fastening holes AH3 may be spaced apart from one another, and spaces, in which the plurality of flexible films 130 may be bent, may be ensured between the plurality of first fastening parts FP1. The third fastening holes AH3 may be holes for fixing the second cover 110b and the cover part to be described below. FIG. 3A illustrates nine third fastening holes AH3. However, the number of third fastening holes AH3 is an example, and the present disclosure is not limited thereto.

FIG. 3A illustrates that the second fastening holes AH2 and the third fastening holes AH3 for fastening the cover part, the first cover 110a, and the second cover 110b are respectively disposed in the second support area PA2 of the first cover 110a and one end of the second cover 110b. However, the first cover 110a, the second cover 110b, and the cover part may be fixed to one another without a separate fastening hole.

Meanwhile, in case that the second support area PA2 and the plurality of first fastening parts FP1 are wound around the roller 151, the outer peripheral surface of the roller 151, which overlaps with the second support area PA2 and the plurality of first fastening parts FP1, may be the flat surface portion 151F. Therefore, the second support area PA2 may always be kept flat regardless of a state in which the second support area PA2 is wound around or unwound from the roller 151. The printed circuit board 140 and the pad area at one end of the display panel 120 disposed in the second support area PA2 may also be kept flat.

An area from one end to the other end of the second cover 110b is an area extending so that a display area AA of the display panel 120 may be disposed outside the housing part HP. For example, when the first cover 110a and the display panel 120 are in the fully unwound state, the area from the other end of the second cover 110b fixed to the roller 151 to one end of the second cover 110b at which the plurality of flexible films 130 and the printed circuit board 140 are disposed may be disposed inside the housing part HP. The ductile area MA on which the display area AA of the display panel 120 is disposed and the first support area PA1 may be disposed outside the housing part HP. That is, the area from the other end of the second cover 110b fixed to the roller 151 to the second support area PA2 and at least a part of one end of the second cover 110b may be disposed inside the housing part HP.

The other end of the second cover 110b is a lowermost end area of the second cover 110b that is fastened to the roller 151. Fourth fastening holes AH4 may be formed at the other end of the second cover 110b so that the second cover 110b is fastened to the roller 151. For example, fastening members may be disposed to penetrate the roller 151 and the fourth fastening holes AH4, such that the roller 151 may be fastened to the other end of the second cover 110b. Further, as the other end of the second cover 110b is fastened to the roller 151, the display panel 120, the first cover 110a, and the second cover 110b may be wound around or unwound from the roller 151. FIG. 3A illustrates two fourth fastening holes AH4. However, the number of fourth fastening holes AH4 is not limited thereto.

Meanwhile, the plurality of opening portions 111, which is formed in the ductile area MA of the first cover 110a, is not formed in the second cover 110b. Specifically, the third fastening holes AH3 and the fourth fastening holes AH4 are formed at one end and the other end of the second cover 110b. However, the plurality of opening portions 111, which is formed in the ductile area MA of the first cover 110a, is not formed in the second cover 110b. In addition, the third fastening hole AH3 and the fourth fastening hole AH4 are different in shape from the plurality of opening portions 111.

The second cover 110b may be made of a material having flexibility so that the second cover 110b may be wound around or unwound from the roller 161. For example, the second cover 110b may be made of a plastic material such as polyethylene terephthalate (PET). However, the material of the second cover 110b may be variously changed in accordance with design as long as the material of the second cover 110b satisfies physical property conditions such as a thermal deformation amount, a radius of curvature, rigidity, and the like. However, the present disclosure is not limited thereto.

In the present specification, the configuration has been described in which the first cover 110a and the second cover 110b are separately formed. However, the present disclosure is not limited thereto. The first cover 110a and the second cover 110b may be integrated.

With reference to FIG. 3B, the display panel 120 is disposed on one surface of the first cover 110a. The display panel 120 is disposed in the ductile area MA on one surface of the first cover 110a. The display panel 120 is a panel configured to display images to a user. The display panel 120 may include a display element configured to display images, a driving element configured to operate the display element, and lines configured to transmit various types of signals to the display element and the driving element.

The display elements may have different configurations depending on the type of display panel 120. For example, in a case in which the display panel 120 is an organic light-emitting display panel 120, the display element may be an organic light-emitting element including an anode, an organic light-emitting layer, and a cathode. For example, in a case in which the display panel 120 is a liquid crystal display panel, the display element may be a liquid crystal display element. Hereinafter, the assumption is made that the display panel 120 is the organic light-emitting display panel. However, the display panel 120 is not limited to the organic light-emitting display panel. In addition, because the display device 100 according to the exemplary aspect of the present disclosure is a rollable display device 100, the display panel 120 may be implemented as a flexible display panel 120 to be wound around or unwound from the roller 151.

The display panel 120 includes the display area AA and a non-display area NA.

The display area AA is an area of the display panel 120 in which images are displayed. The display area AA may include a plurality of subpixels constituting the plurality of pixels, and a drive circuit configured to operate the plurality of subpixels. The plurality of subpixels is minimum units constituting the display area AA. The display element may be disposed in each of the plurality of subpixels. For example, the plurality of subpixels may each include the light-emitting element including an anode, a light-emitting part, and a cathode. However, the present disclosure is not limited thereto. In addition, the drive circuit configured to operate the plurality of subpixels may include driving elements, lines, and the like. For example, the drive circuit may include, but not limited to, a thin-film transistor, a storage capacitor, a gate line, a data line, and the like.

The non-display area NA is an area in which no image is displayed. Various lines and circuits for operating the organic light-emitting element in the display area AA are disposed in the non-display area NA. For example, the non-display area NA may include link lines for transmitting signals to the plurality of subpixels and the drive circuit in the display area AA. The non-display area NA may include a drive IC such as a gate driver IC and a data driver IC. However, the present disclosure is not limited thereto.

Meanwhile, the non-display area NA includes the pad area.

The pad area is an area in which a plurality of pads is disposed. The plurality of pads is electrodes for electrically connecting the plurality of flexible films 130 and the display panel 120. The plurality of flexible films 130 and the display panel 120 may be electrically connected through the plurality of pads. In the non-display area NA, the pad area may be the non-display area NA that overlaps with the second support area PA2 of the first cover 110a. However, the pad area may be formed in another portion of the non-display area NA in accordance with the arrangement of the plurality of flexible films 130. However, the present disclosure is not limited thereto.

With reference to FIG. 3B, the plurality of flexible films 130 are disposed at one end of the display panel 120. The plurality of flexible films 130 each are a film having various types of components disposed on a base film 131 having ductility to supply signals to the plurality of subpixels constituting the plurality of pixels and to the drive circuit in the display area AA. The plurality of flexible films 130 may be electrically connected to the display panel 120. The plurality of flexible films 130 is disposed at one end of the non-display area NA of the display panel 120 and may supply power voltage, data voltage, and the like to the plurality of subpixels and the drive circuit in the display area AA. Meanwhile, FIG. 3B illustrates eight flexible films 130. However, the number of flexible films 130 may be variously changed in accordance with design. However, the present disclosure is not limited thereto.

The drive ICs 132 such as gate driver ICs and data driver ICs may be disposed on the base films 131 of the plurality of flexible films 130. The drive IC 132 is a component configured to process data for displaying the image and process a driving signal for processing the data. The drive IC 132 may be disposed in ways such as a chip-on-glass (COG) method, a chip-on-film (COF) method, and a tape carrier package (TCP) method depending on how the drive IC is mounted. However, in FIG. 3B, for the convenience of description, the configuration has been described in which the drive ICs 132 are mounted on the plurality of flexible films 130 by the chip-on-film method. However, the present disclosure is not limited thereto.

Meanwhile, the plurality of flexible films 130 is components including the base films, the data drivers configured to display images on the base films, and the various types of drive ICs configured to control the data drivers. The plurality of flexible films 130 is components for displaying the images. The plurality of flexible films 130 are electrically connected to the pad area at one end of the display panel 120 and bent toward the rear surface of the first cover 110a. One end of each of the plurality of flexible films 130 may be connected to one end of the display panel 120 on one surface of the first cover 110a, and the other end of each of the plurality of flexible films 130 may be disposed on a surface of the first cover 110a opposite to one surface of the first cover 110a.

With reference to FIG. 3B, the printed circuit board 140 is disposed on the rear surface of the first cover 110a and connected to the plurality of flexible films 130. That is, the printed circuit board 140 disposed adjacent to the rear surface of the first cover 110a and electrically connected to the plurality of flexible films 130. The printed circuit board 140 is a component configured to supply a signal to the drive IC of each of the plurality of flexible films 130. Various types of components for supplying the drive IC with various signals such as driving signals, data signals, and the like may be disposed on the printed circuit board 140. Meanwhile, FIG. 3B illustrates two printed circuit boards 140. However, the number of printed circuit boards 140 may be variously changed in accordance with design. The present disclosure is not limited thereto.

Meanwhile, although not illustrated in FIG. 3B, an additional printed circuit board connected to the printed circuit board 140 may be further disposed. For example, the printed circuit board 140 may be called a source printed circuit board (source PCB (S-PCB)) on which a data drive part is mounted. The additional printed circuit board connected to the printed circuit board 140 may be called a control printed circuit board (control PCB (C-PCB)) on which the timing controller and the like are mounted. The additional printed circuit board may be disposed in the roller 151, disposed on the housing part HP outside the roller 151, or disposed to directly adjoin the printed circuit board 140.

Figure 4:
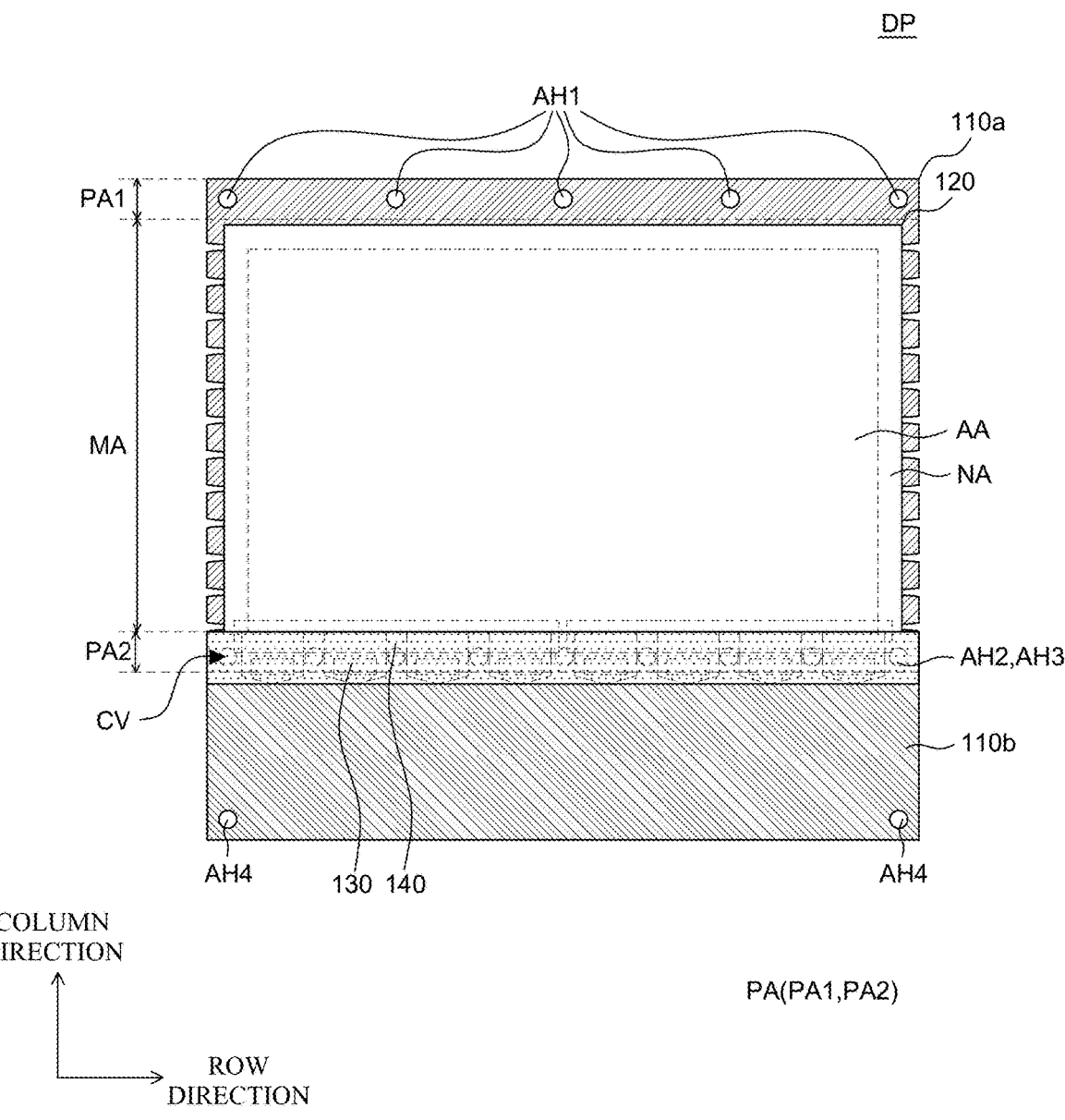
FIG. 4 is a top plan view of the display device according to the exemplary aspect of the present disclosure.

FIG. 4 is a top plan view of the display device according to the exemplary aspect of the present disclosure.

With reference to FIG. 4, a cover part CV is disposed to accommodate and protect the pad area, the plurality of flexible films 130, and the printed circuit board 140 of the display panel 120. The cover part CV may be disposed in the second support area PA2 of the first cover 110*a* and at one end of the second cover 110*b* and connect the first cover 110*a* and the second cover 110*b*. In addition, the cover part CV may maintain the printed circuit board 140 and the pad area at one end of the display panel 120 in the flat state and protect the plurality of flexible films 130.

The cover part CV may include a top cover and a bottom cover.

An outer surface of the top cover may have a convex shape and be connected to the curved surface portion 151R of the roller 151, thereby defining a rounded shape or defining a circular shape connected to the curved surface portion 151R of the roller. That is, one surface of the top cover may be formed as a curved surface. Further, when the display part DP is wound, the top cover may define a rounded shape connected to the curved surface portion 151R of the roller 151 or define a circular shape connected to the curved surface portion 151R of the roller.

The bottom cover may be disposed to be opposite to the top cover. The plurality of flexible films 130 and the printed circuit board 140 may be seated between the top cover and the bottom cover. Therefore, the cover part CV may protect the plurality of flexible films 130 and the printed circuit board 140.

<Drive Part>

Figure 5:
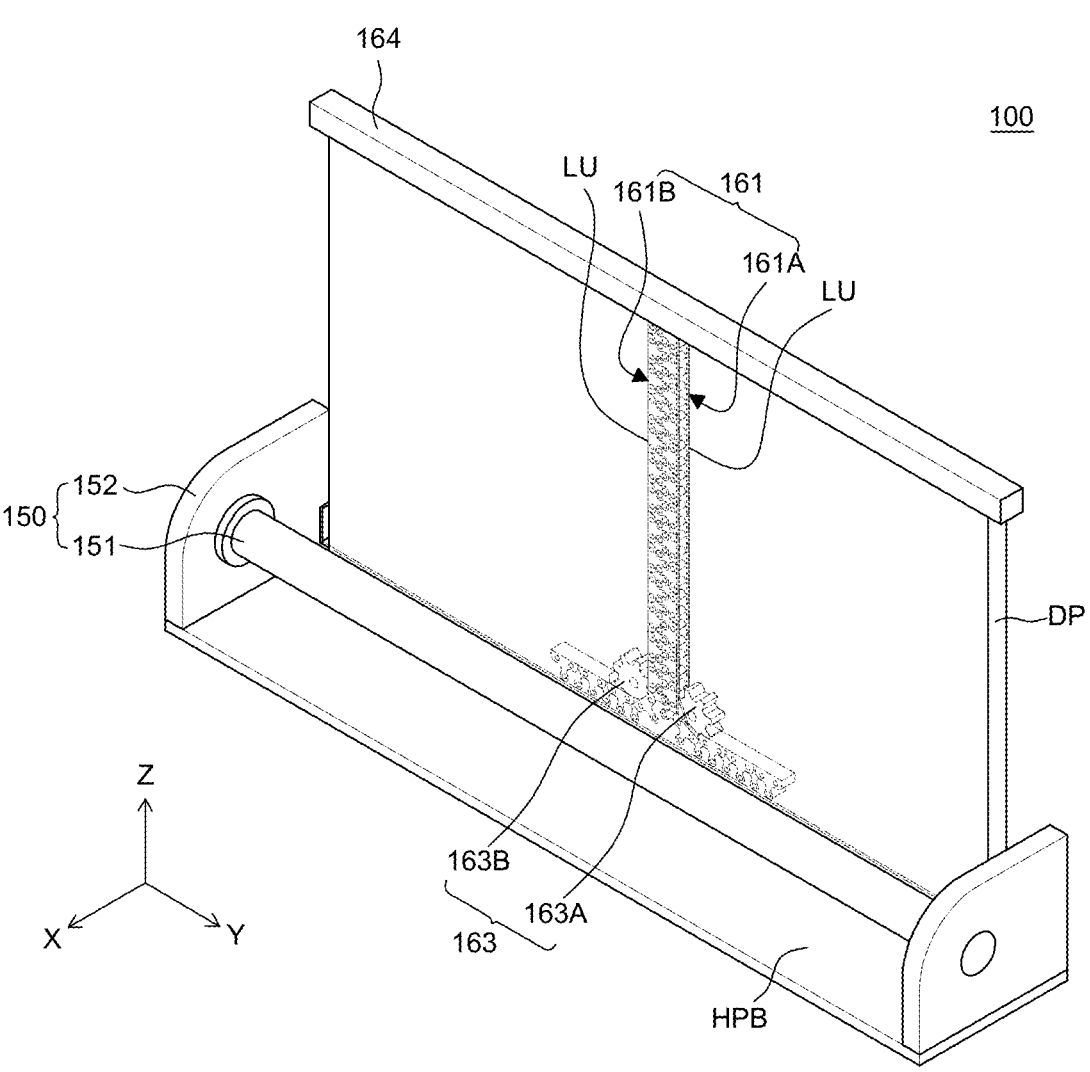
FIG. 5 is a perspective view of the display device according to the exemplary aspect of the present disclosure.
Figure 6:
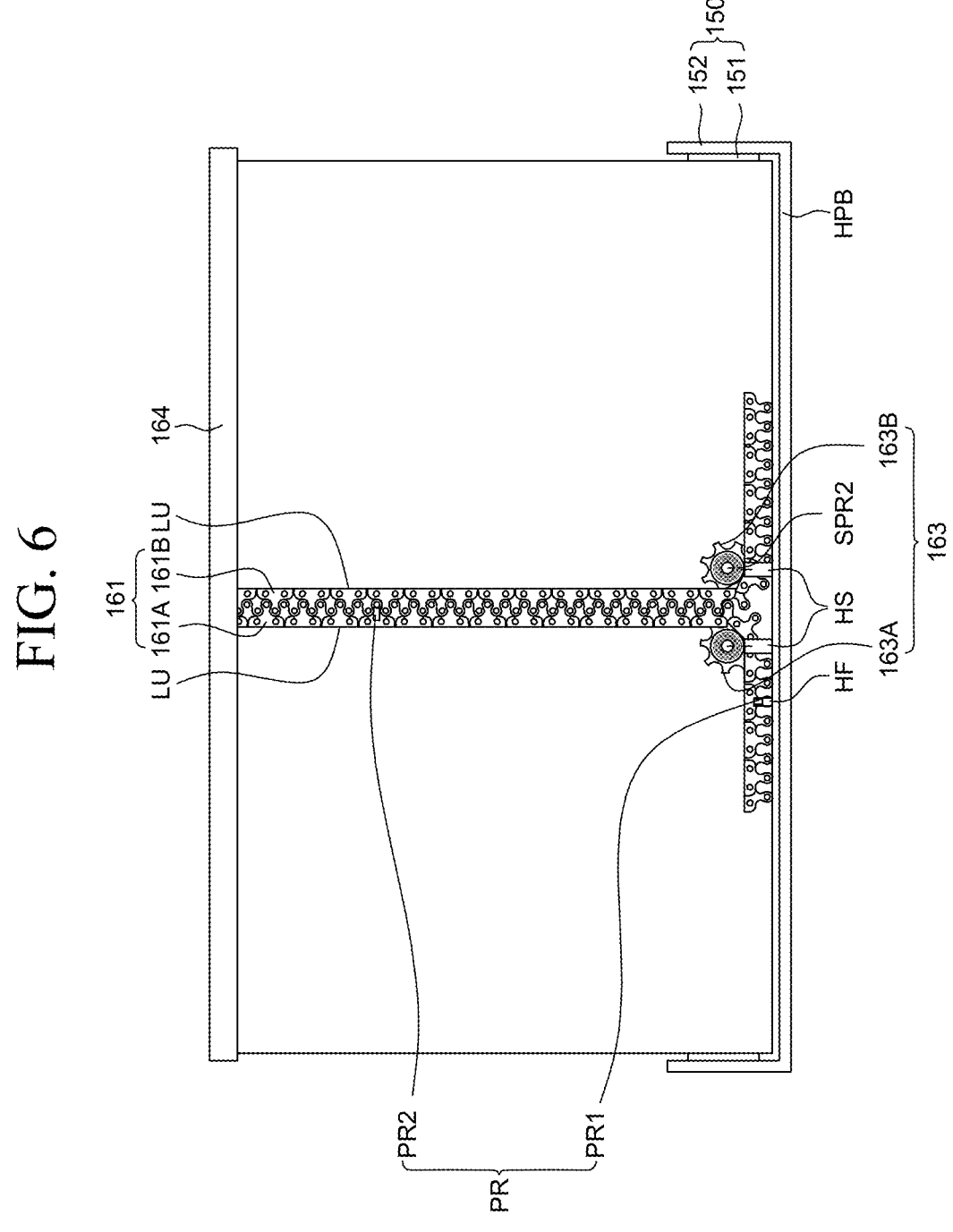
FIGS. 6 and 7 are rear views of the display device according to the exemplary aspect of the present disclosure.
Figure 7:
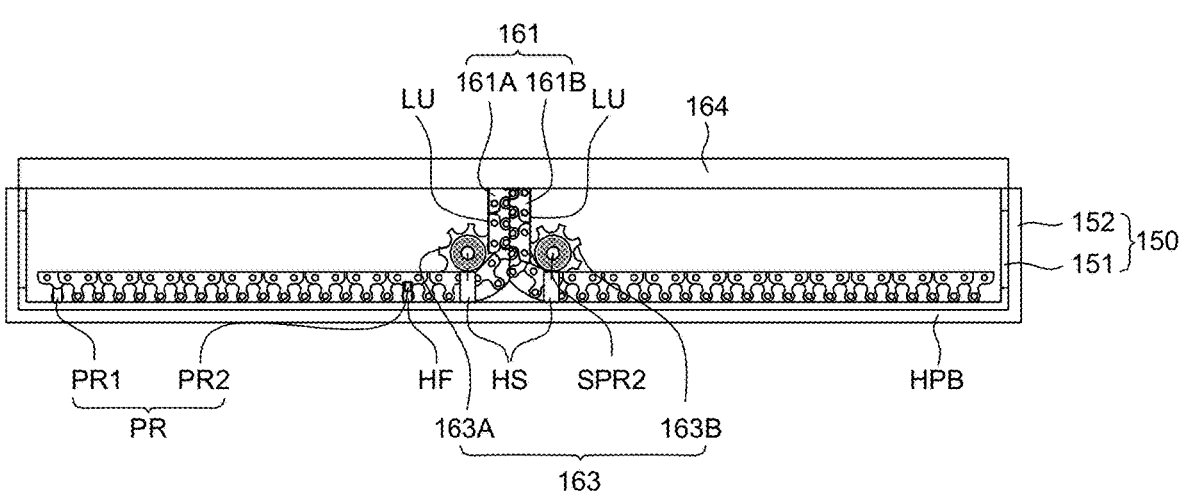
Figure 8:
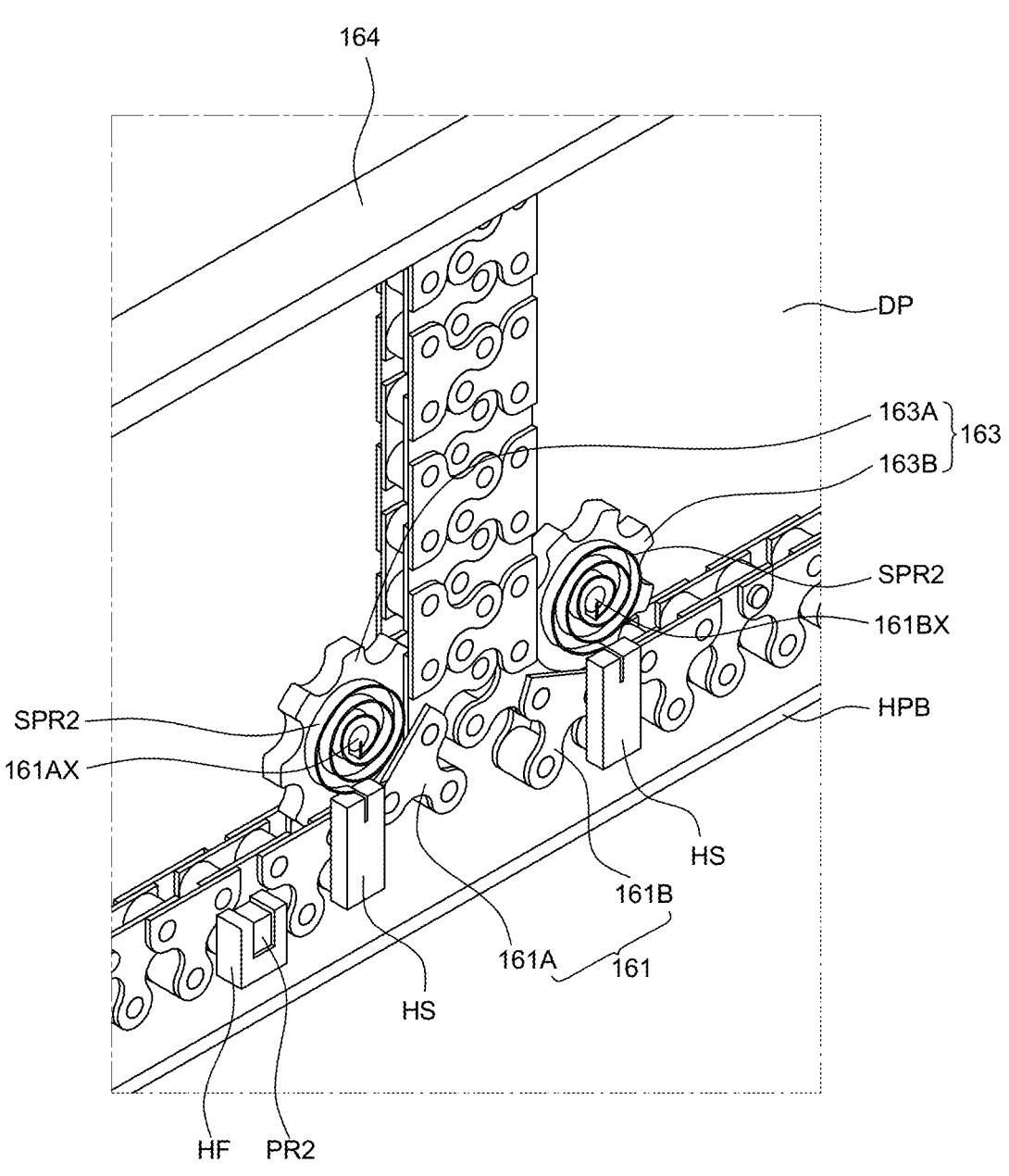
FIG. 8 is a perspective view of the display device according to the exemplary aspect of the present disclosure.

FIG. 5 is a perspective view of the display device according to the exemplary aspect of the present disclosure. FIGS. 6 and 7 are rear views of the display device according to the exemplary aspect of the present disclosure. FIG. 8 is a perspective view of the display device according to the exemplary aspect of the present disclosure. FIG. 6 is a rear view of the display device 100 when the display part DP is in a fully unwound state, and FIG. 7 is a rear view of the display device 100 when the display part DP is in a fully wound state. In addition, FIG. 8 is an enlarged perspective view of the display device 100 when the display part DP is in the fully wound state.

First, with reference to FIGS. 5 to 8, the drive part MP includes a roller part 150 and a lifting unit 160.

The roller part 150 is disposed in the housing part HP and wind and unwind the display part DP while rotating clockwise or counterclockwise.

The roller part 150 may include the roller 151 configured to wind or unwind the display part DP, and roller support parts 152 configured to rotatably support two opposite ends of the roller 151.

The roller support parts 152 may be installed on a bottom surface HPB of the housing part HP and disposed at two opposite sides of the roller 151 based on a longitudinal direction of the roller 151. The roller support parts 152 may support the roller 151. The roller 151 supported on the roller support part 152 may be disposed to be spaced apart from the bottom surface HPB of the housing part HP at a predetermined interval. For example, the roller support part 152 may include a bracket member installed on the bottom surface HPB of the housing part HP, and a bearing member coupled to the bracket member and configured to rotatably support the roller 151.

The lifting unit 160 may be disposed at a rear side of the first cover 110*a* at which the display panel 120 is not disposed. The lifting unit 160 may move the first cover 110*a* and the display panel 120 in an upward/downward direction, i.e., a Z-axis direction.

The lifting unit 160 may include a plurality of chain units 161, a plurality of driving sprockets 163, and the head bar 164.

The plurality of chain units 161 is coupled to the head bar 164 and supports the head bar 164 that fixes an upper end of the display part DP. The plurality of chain units 161 may receive power from the plurality of driving sprockets 163 and move the head bar 164 upward or downward while moving in the upward/downward direction. Therefore, the plurality of chain units 161 may be connected to the display panel 120 through the head bar 164 to move the display panel 120 in the upward/downward direction.

The plurality of chain units 161 is coupled to and engages with one another and rectilinearly moves in the upward/downward direction, i.e., the Z-axis direction when the plurality of chain units 161 moves upward or downward. The plurality of chain units 161 is separated from each other and rectilinearly moves in a leftward/rightward direction, i.e., a Y-axis direction when the plurality of chain units 161 moves downward. Therefore, the plurality of chain units 161 may define a zipper-type structure.

Specifically, the plurality of chain units 161 may include first chain units 161A and second chain units 161B disposed to face one another in the leftward/rightward direction. The first chain unit 161A and the second chain unit 161B may each have a structure in which a plurality of link units LU is connected in the longitudinal direction, and the plurality of link units LU may be coupled to and engage with one another like serrated structures. Therefore, when the plurality of driving sprockets 163 moves the first and second chain units 161A and 161B upward, the first and second chain units 161A and 161B, which are separated from one another, may be coupled to and engage with one another, thereby moving upward the head bar 164 coupled to the upper end. Further, when the plurality of driving sprockets 163 moves the first and second chain units 161A and 161B downward, the first and second chain units 161A and 161B, which are coupled to one another, may be separated, thereby moving downward the head bar 164 coupled to the upper end. In this case, the first and second chain units 161A and 161B, which are coupled to one another, may rectilinearly move in the upward/downward direction. The first and second chain units 161A and 161B, which are separated from one another, may rectilinearly move in the leftward/rightward direction. That is, when the display part DP is not exposed to the outside of the housing part HP, the first and second chain units 161A and 161B may be separated from one another to the left and right sides in the longitudinal direction of the housing part HP and accommodated in the housing part HP.

The plurality of driving sprockets 163 may be disposed to engage with the plurality of chain units 161 and move the plurality of chain units 161. The plurality of driving sprockets 163 may include a first driving sprocket 163A and a second driving sprocket 163B.

The first driving sprocket 163A may be coupled to the first chain unit 161A. The first driving sprocket 163A may generate a rotational force and transmit power to the first chain unit 161A. Further, a plurality of serrated members may be provided on a periphery of the first driving sprocket 163A. The plurality of serrated members may be coupled to the first chain unit 161A and press the first chain unit 161A. In addition, the first driving sprocket 163A includes a central shaft 161AX that is a shaft to which one end of a second spring SPR2 is fixed.

The second driving sprocket 163B may be disposed to face the first driving sprocket 163A in the leftward/rightward direction, i.e., the Y-axis direction and coupled to the second chain unit 161B. Further, the second driving sprocket 163B may generate a rotational force and transmit power to the second chain unit 161B. In this case, the second driving sprocket 163B may transmit power to the second chain unit 161B by rotating in a direction opposite to a direction in which the first driving sprocket 163A rotates. Further, a plurality of serrated members may be provided on a periphery of the second driving sprocket 163B. The plurality of serrated members may be coupled to the second chain unit 161B and press the second chain unit 161B. In addition, the second driving sprocket 163B includes a central shaft 161BX that is a shaft to which one end of the second spring SPR2 is fixed.

The roller 151 may unwind the display part DP by using elastic forces of the plurality of second springs SPR2.

Specifically, the plurality of second springs SPR2 is connected to the plurality of driving sprockets 163. One end of the second spring SPR2, which is connected to the first driving sprocket 163A among the plurality of second springs SPR2, is fixed to the central shaft 161AX, which is a shaft of the first driving sprocket 163A, e.g., a groove of the central shaft 161AX. The other end of the second spring SPR2 is fixed to a spring fixing part HS installed on the bottom surface HPB of the housing part HP, i.e., a groove of the spring fixing part HS. In addition, one end of the second spring SPR2, which is connected to the second driving sprocket 163B among the plurality of second springs SPR2, is fixed to the central shaft 161BX, which is a shaft of the second driving sprocket 163B, e.g., a groove of the central shaft 161BX. The other end of the second spring SPR2 is fixed to the spring fixing part HS installed on the bottom surface HPB of the housing part HP, e.g., a groove of the spring fixing part HS.

The plurality of second springs SPR2 is compressed when the roller 151 rotates in the first direction DR1 so that the display part DP is wound. When the force for rotating the roller 151 in the first direction DR1 is eliminated, the elastic force may be used to rotate the roller 151 in the second direction DR2, thereby unwinding the display part DP. The second spring SPR2 may be a spiral spring or a torsion spring. However, the present disclosure is not limited thereto.

The plurality of chain units 161 and the housing part HP may include locking structures that restrict movements of the plurality of chain units 161.

The plurality of chain units 161 includes a plurality of protruding portions PR used as locking structures. The plurality of protruding portions PR may include first protruding portions PR1 and second protruding portions PR2. In this case, FIGS. 6 to 8 illustrate that the first chain unit 161A includes the first protruding portion PR1 and the second protruding portion PR2. However, the second chain unit 161B may include the first protruding portion PR1 and the second protruding portion PR2.

In case that the display panel 120 is fully wound, the first protruding portion PR1 may be inserted into a fixing part HF of the housing part HP. The first protruding portion PR1 may be disposed to protrude to the outside from a surface of the first chain unit 161A. The first protruding portion PR1 may be integrated with the first chain unit 161A. Alternatively, the first protruding portion PR1 may be manufactured separately from the first chain unit 161A and attached to the first chain unit 161A. The first protruding portion PR1 may have a rectangular parallelepiped shape. However, the present disclosure is not limited thereto.

In case that the display panel 120 is fully unwound, the second protruding portion PR2 may be inserted into the fixing part HF of the housing part HP. The second protruding portion PR2 may be disposed to protrude to the outside from the surface of the first chain unit 161A. The second protruding portion PR2 may be integrated with the first chain unit 161A. Alternatively, the second protruding portion PR2 may be manufactured separately from the first chain unit 161A and attached to the first chain unit 161A. FIG. 8 illustrates that the second protruding portion PR2 has a rectangular parallelepiped shape. However, the present disclosure is not limited thereto.

The housing part HP includes the fixing part HF for fixing the plurality of protruding portions PR. The fixing part HF may have a shape protruding from the bottom surface HPB of the housing part HP. When the plurality of protruding portions PR is inserted into the fixing part HF, the protruding portion PR is fixed to the fixing part HF, and the plurality of chain units 161 may be fixed so as not to move.

Meanwhile, the plurality of protruding portions PR may be configured to be accommodated in the plurality of chain units 161. For example, grooves may be disposed in the first chain unit 161A, and springs connected to the plurality of protruding portions PR may be disposed in the grooves. Therefore, when the forces for pressing the plurality of protruding portions PR are applied from the outside, the plurality of protruding portions PR may be accommodated in the grooves in the first chain unit 161A. Therefore, the protruding portion PR may be easily inserted into or released from the fixing part HF.

In addition, an unlocking structure may be used to release a state in which the plurality of protruding portions PR is inserted into the fixing part HF. For example, when a user desires to perform unlocking, the user may press the protruding portion PR by using a mechanical unlocking structure, such as a button, or an electrical unlocking structure. In this case, the protruding portion PR may be released from the fixing part HF, and the plurality of chain units 161 may move.

The head bar 164 may fix the upper end of the display part DP. The head bar 164 may be coupled to the upper ends of the first and second chain units 161A and 161B coupled to each other and move together with the first and second chain units 161A and 161B. Therefore, the head bar 164 may move the display part DP upward or downward in the upward/downward direction, i.e., the Z-axis direction by means of the first and second chain units 161A and 161B. For example, the head bar 164 may be fixed to the first support area PA1 of the first cover 110*a* and disposed to cover only a part of a surface adjacent to an uppermost end edge of the first cover 110*a* so as not to cover an image displayed on the front surface of the display panel 120.

Hereinafter, processes of winding and unwinding the display device 100 according to the exemplary aspect of the present disclosure will be described in detail with reference to FIGS. 9 to 10H.

<Winding and Unwinding Processes>

Figure 9:
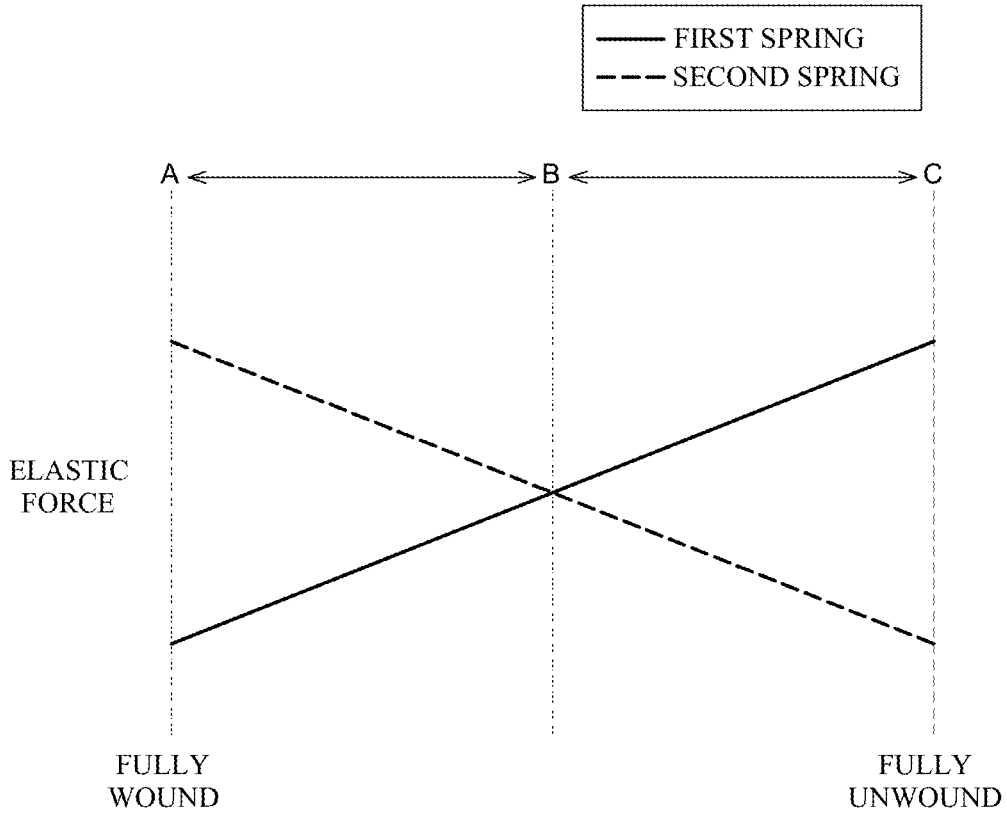
FIG. 9 is a graph for explaining elastic forces of first and second springs according to processes of winding and unwinding a display panel of the display device according to the exemplary aspect of the present disclosure.

FIG. 9 is a graph for explaining elastic forces of the first and second springs according to the processes of winding and unwinding the display panel of the display device according to the exemplary aspect of the present disclosure. FIGS. 10A to 10H are views for explaining the processes of winding and unwinding the display panel of the display device according to the exemplary aspect of the present disclosure. FIG. 9 illustrates changes in elastic forces of the first and second springs SPR1 and SPR2 depending on changes in states between a fully wound state A and a fully unwound state C of the display panel 120.

With reference to FIG. 9, the elastic force of the first spring SPR1 may be maximized in the state in which the display panel 120 is fully unwound from the roller 151 and minimized in the state in which the display panel 120 is fully wound around the roller 151. That is, the first spring SPR1 is maximally compressed in the state in which the display panel 120 is fully unwound from the roller 151. Therefore, in the state in which the display panel 120 is fully unwound from the roller 151, the first spring SPR1 may have a maximum elastic force that rotates the roller 151 to wind the display panel 120.

The first spring SPR1 may transmit a force to the roller 151 in a direction in which the display panel 120 is wound around the roller 151. Therefore, the display panel 120 may be wound around the roller 151, and the elastic force of the first spring SPR1 may linearly decrease. Therefore, in the state in which the display panel 120 is fully wound around the roller 151, the elastic force of the first spring SPR1 may be minimized. In contrast, the display panel 120 may be unwound from the roller 151 by the user's effort or the elastic force of the second spring SPR2, and the elastic force of the first spring SPR1 may linearly increase.

The elastic force of the second spring SPR2 may be maximized in the state in which the display panel 120 is fully wound around the roller 151 and minimized in the state in which the display panel 120 is fully unwound from the roller 151. That is, the second spring SPR2 is maximally compressed in the state in which the display panel 120 is fully wound around the roller 151. Therefore, in the state in which the display panel 120 is fully wound around the roller 151, the second spring SPR2 may have a maximum elastic force that rotates the roller 151 to unwind the display panel 120.

The second spring SPR2 may transmit a force to the roller 151 in a direction in which the display panel 120 is unwound from the roller 151. Therefore, the display panel 120 may be unwound from the roller 151, and the elastic force of the second spring SPR2 may linearly decrease. Therefore, in the state in which the display panel 120 is fully unwound from the roller 151, the elastic force of the second spring SPR2 may be minimized. In contrast, the display panel 120 may be wound around the roller 151 by the user's effort or the elastic force of the first spring SPR1, and the elastic force of the second spring SPR2 may linearly increase.

Figure 10A:
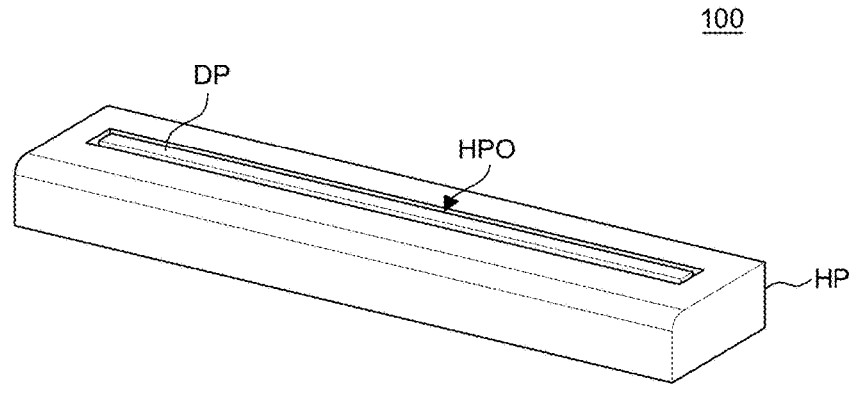
FIGS. 10A to 10H are views for explaining the processes of winding and unwinding the display panel of the display device according to the exemplary aspect of the present disclosure.
Figure 10B:
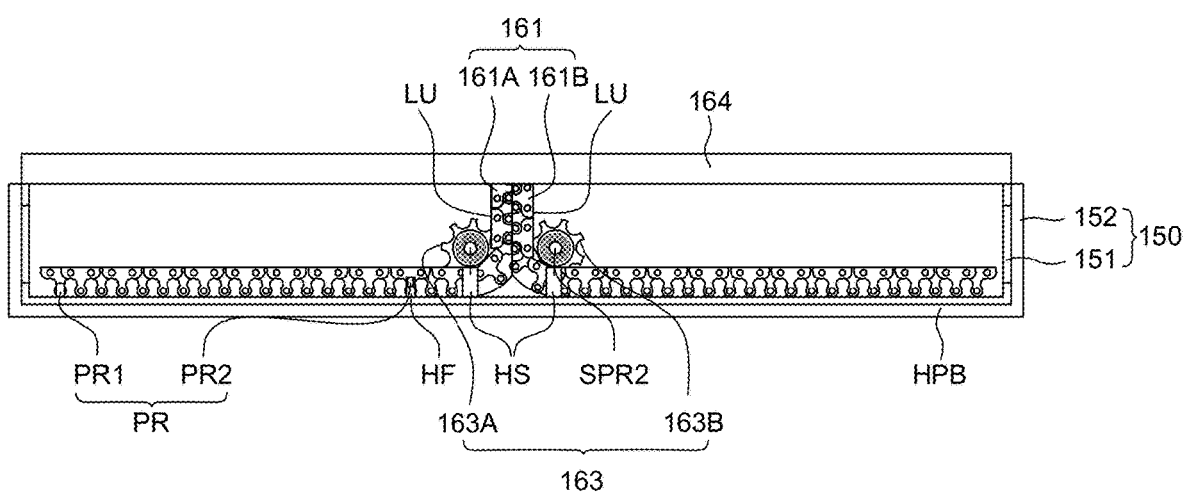

First, with reference to FIGS. 10A and 10B, FIGS. 10A and 10B are perspective and rear views of the display device

100 when the display panel 120 is in the fully wound state A. When the display panel 120 is in the fully wound state A, the second protruding portion PR2, among the plurality of protruding portions PR, is fixed to the fixing part HF. As the second protruding portion PR2 is fixed to the fixing part HF, the plurality of chain units 161 may also be fixed.

Figure 10C:
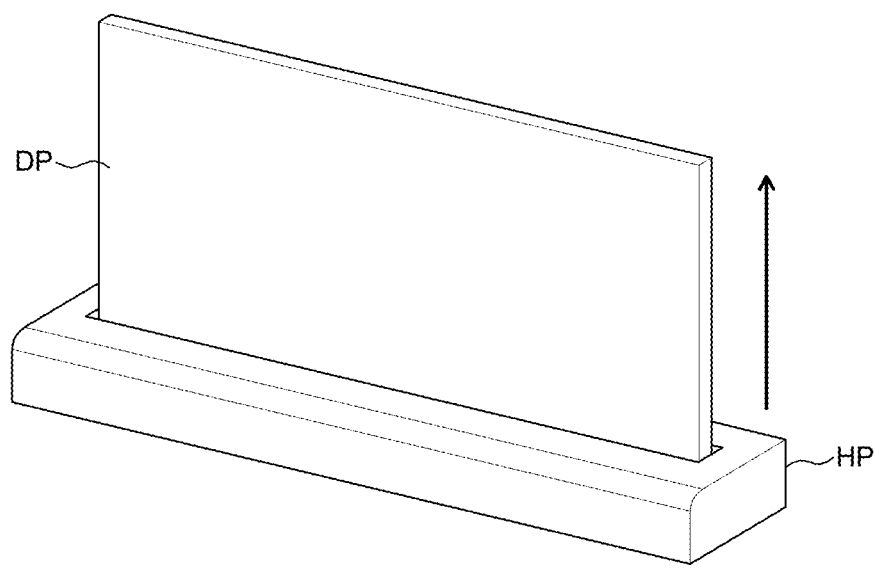

Next, FIG. 10C is a perspective view of the display device 100 in an equilibrium state B between the elastic force of the first spring SPR1 and the elastic force of the second spring SPR2. In case that the display panel 120 is unlocked in the fully wound state, the elastic force of the second spring SPR2 may be higher than the elastic force of the first spring SPR1, as illustrated in FIG. 9. Therefore, the driving sprockets 163 are rotated by the elastic force of the second spring SPR2, and the plurality of chain units 161 is moved upward by the rotation of the driving sprocket 163. Therefore, the head bar 164 and the display panel 120, which are connected to the plurality of chain units 161, also move upward. Therefore, the display panel 120 begins to be unwound, and the roller 151 may rotate. That is, the roller 151 may be rotated by the elastic force of the second spring SPR2.

In case that the display panel 120 is unlocked in the fully wound state, the display panel 120 may be unwound until the elastic force of the second spring SPR2 and the elastic force of the first spring SPR1 are equilibrated. As illustrated in FIG. 9, as the display panel 120 is unwound, the second spring SPR2 may be decompressed, the elastic force of the second spring SPR2 may decrease, the first spring SPR1 may be compressed, and the elastic force of the first spring SPR1 may increase. Thereafter, the elastic force of the second spring SPR2 and the elastic force of the first spring SPR1 may be equilibrated. That is, the force of the second spring SPR2, which unwinds the display panel 120, and the force of the first spring SPR1, when winds the display panel 120, are equilibrated. Therefore, as illustrated in FIG. 10C, the process of unwinding the display panel 120 may be stopped in the equilibrium state B between the elastic force of the first spring SPR1 and the elastic force of the second spring SPR2.

Figure 10D:
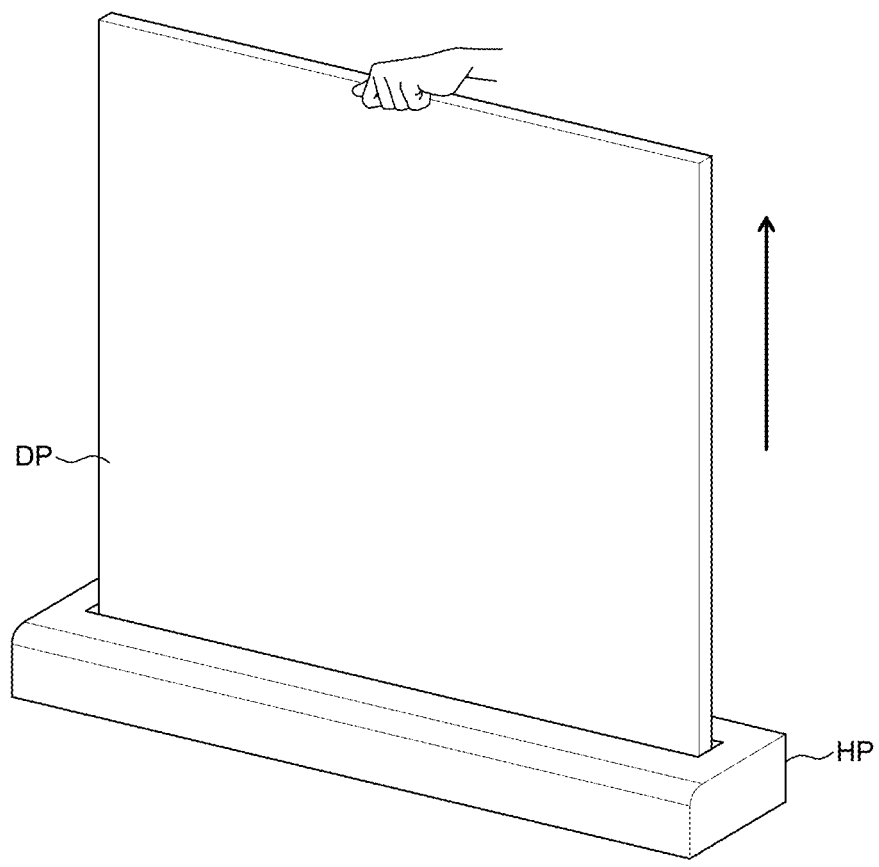

Next, with reference to FIG. 10D, FIG. 10D is a perspective view illustrating the display device 100 and explaining a change in state from the equilibrium state B between the elastic force of the first spring SPR1 and the elastic force of the second spring SPR2 to the fully unwound state C of the display panel 120.

The display panel 120 may be unwound by the user's effort in the equilibrium state B between the elastic force of the first spring SPR1 and the elastic force of the second spring SPR2. The display panel 120 cannot be wound or unwound by the first spring SPR1 and the second spring SPR2 in the equilibrium state B between the elastic force of the first spring SPR1 and the elastic force of the second spring SPR2. Because the display device 100 according to the exemplary aspect of the present disclosure is a rollable display device that is manually operated without a separate motor, the user's external force is required to unwind the display panel 120. Therefore, as illustrated in FIG. 10D, for example, when the user unwinds the display panel 120 with the user's hand, the roller 151 may be rotated by the user's effort.

Figure 10E:
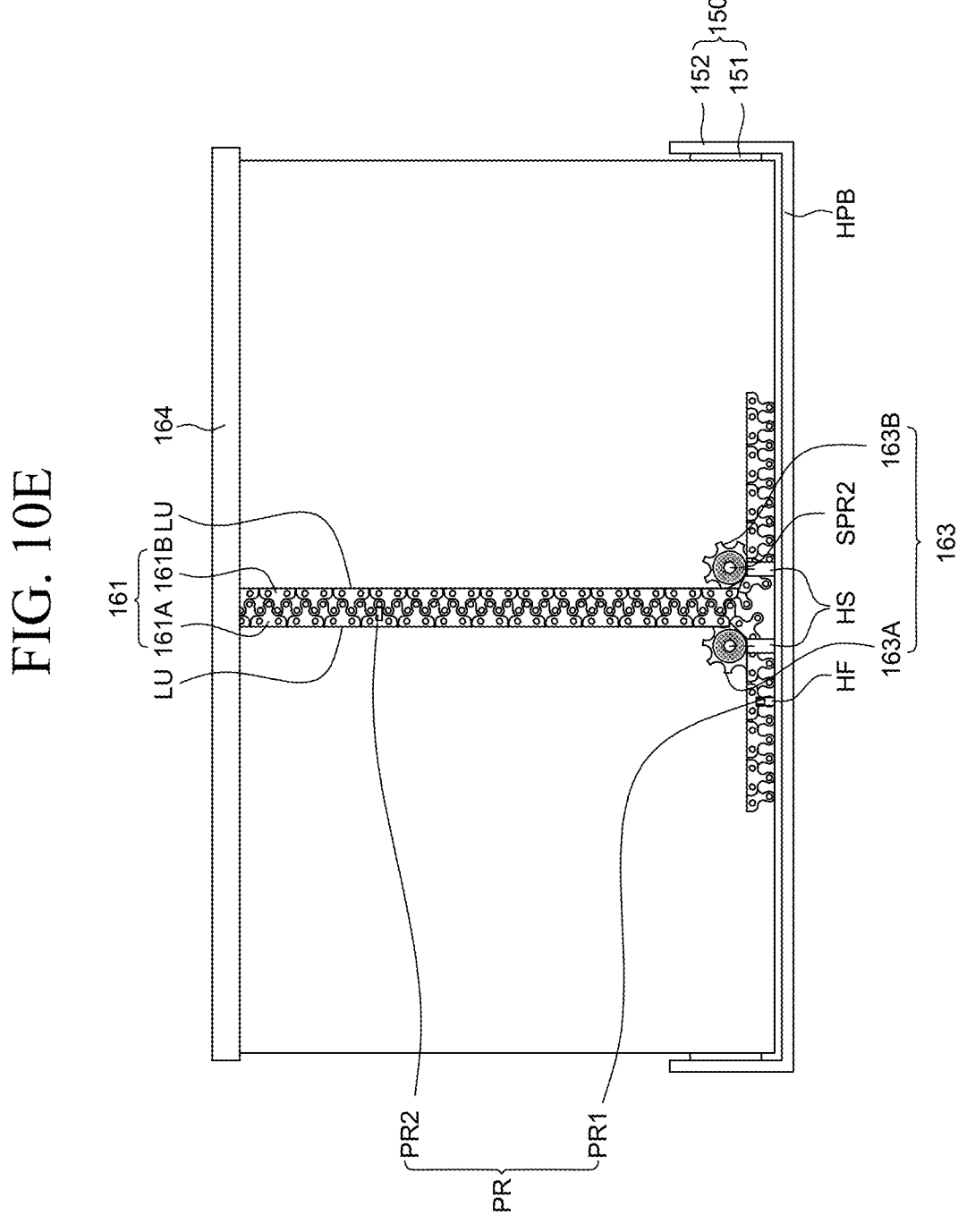

Next, with reference to FIG. 10E, FIG. 10E is a rear view of the display device 100 when the display panel 120 is in the fully unwound state C. In case that the display panel 120 is fully unwound by the user's effort, the first protruding portion PR1, among the plurality of protruding portions PR, is fixed to the fixing part HF. As the first protruding portion PR1 is fixed to the fixing part HF, the plurality of chain units 161 may also be fixed. Therefore, the display panel 120 may be fixed in the fully unwound state C of the display panel 120.

Figure 10F:
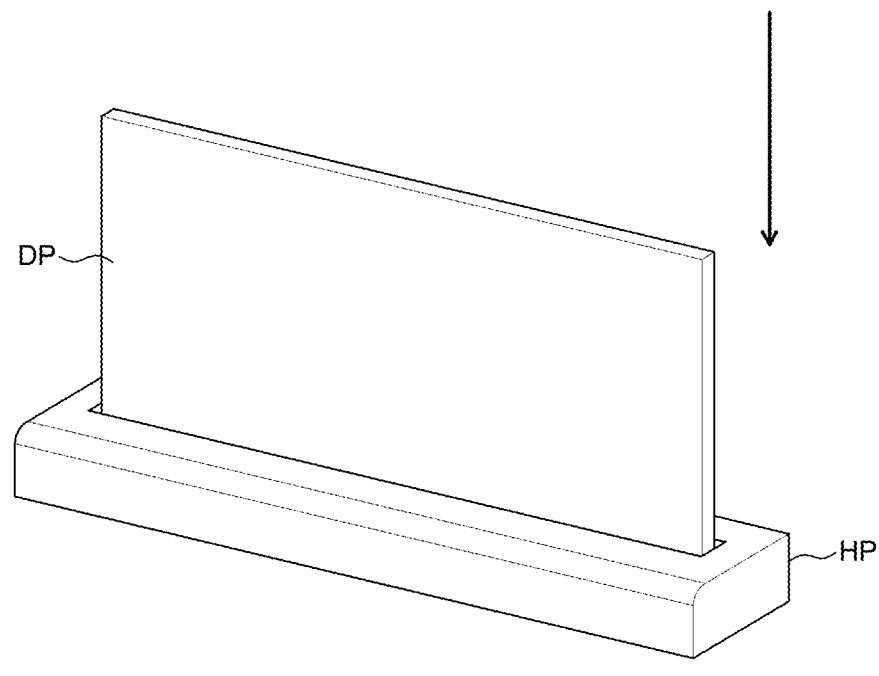

Next, FIG. 10F is a perspective view illustrating the display device 100 and explaining a change in state from the fully unwound state C of the display panel 120 to the equilibrium state B between the elastic force of the first spring SPR1 and the elastic force of the second spring SPR2. In case that the display panel 120 is unlocked in the fully unwound state, and the clastic force of the first spring SPR1 may be higher than the elastic force of the second spring SPR2, as illustrated in FIG. 9. Therefore, the roller 151 is rotated by the elastic force of the first spring SPR1, the display panel 120 is wound around the roller 151 by the rotation of the roller 151, and the head bar 164 connected to the display panel 120 is moved downward. Therefore, the plurality of chain units 161 connected to the head bar 164 is also moved downward, and the driving sprocket 163 is also rotated. That is, the roller 151 may be rotated by the elastic force of the first spring SPR1.

In case that the display panel 120 is unlocked in the fully unwound state, the display panel 120 may be unwound until the elastic force of the first spring SPR1 and the elastic force of the second spring SPR2 are equilibrated. As illustrated in FIG. 9, as the display panel 120 is wound, the first spring SPR1 may be decompressed, the elastic force of the first spring SPR1 may decrease, the second spring SPR2 may be compressed, and the elastic force of the second spring SPR2 may increase. Thereafter, the elastic force of the first spring SPR1 and the elastic force of the second spring SPR2 may be equilibrated. That is, the force of the first spring SPR1, which winds the display panel 120, and the force of the second spring SPR2, which unwinds the display panel 120, are equilibrated. Therefore, as illustrated in FIG. 10, the process of winding the display panel 120 may be stopped in the equilibrium state B between the elastic force of the first spring SPR1 and the elastic force of the second spring SPR2.

Figure 10G:
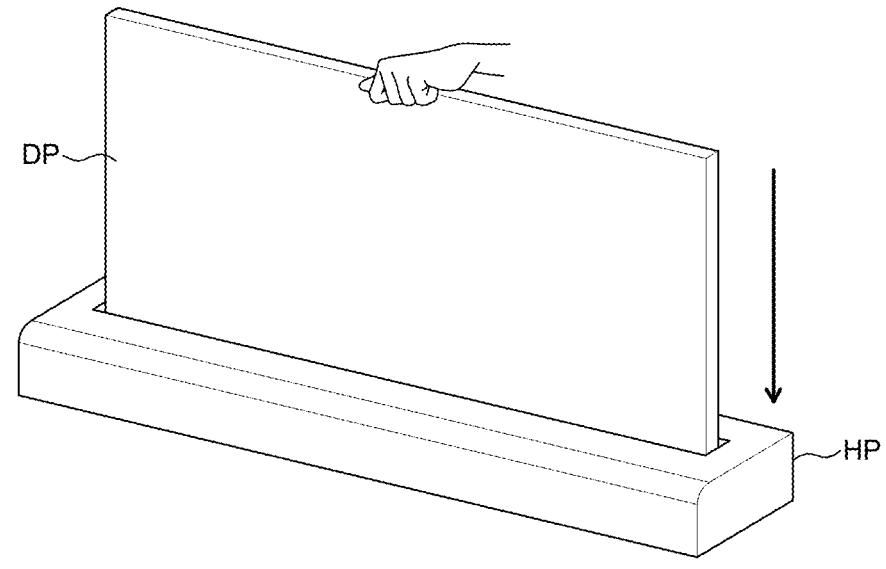

Next, FIG. 10G is a perspective view illustrating the display device 100 and explaining a change in state from the equilibrium state B between the elastic force of the first spring SPR1 and the elastic force of the second spring SPR2 to the fully wound state A of the display panel 120.

The display panel 120 may be wound by the user's effort in the equilibrium state B between the elastic force of the first spring SPR1 and the elastic force of the second spring SPR2. The display panel 120 cannot be wound or unwound by the first spring SPR1 and the second spring SPR2 in the equilibrium state B between the elastic force of the first spring SPR1 and the elastic force of the second spring SPR2. Because the display device 100 according to the exemplary aspect of the present disclosure is a rollable display device that is manually operated without a separate motor, the user's external force is required to wind the display panel 120. Therefore, as illustrated in FIG. 10G, for example, when the user winds the display panel 120 with the user's hand, the roller 151 may be rotated by the user's effort.

Figure 10H:
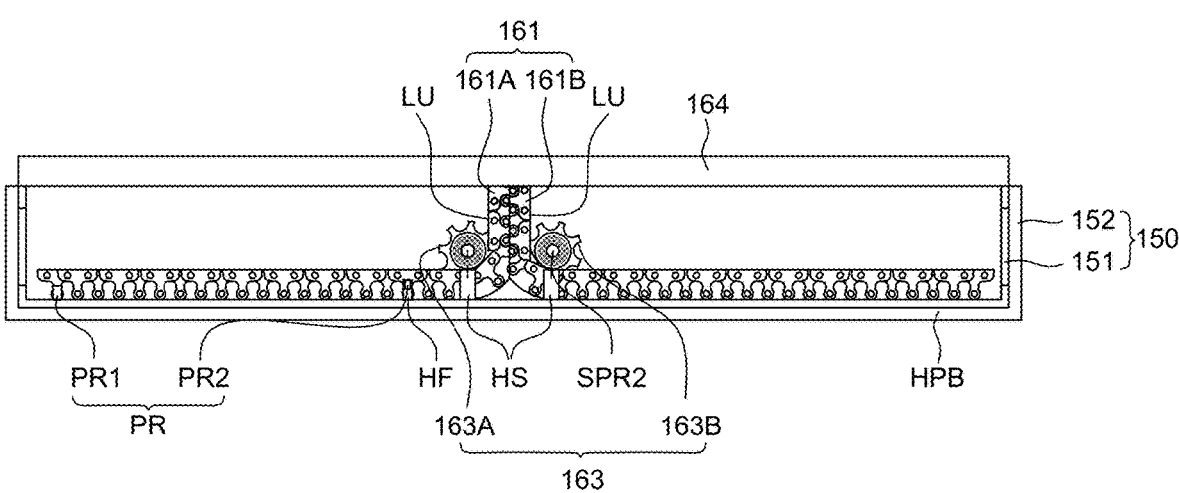

Next, FIG. 10H is a rear view of the display device 100 in the fully wound state A of the display panel 120. In case that the display panel 120 is fully wound by the user's effort, the second protruding portion PR2, among the plurality of protruding portions PR, is fixed to the fixing part HF. As the second protruding portion PR2 is fixed to the fixing part HF, the plurality of chain units 161 may also be fixed. Therefore, the display panel 120 may be fixed in the fully wound state A of the display panel 120.

The rollable display devices are classified into a type that is operated by an external power source such as a motor, and a type that is operated by the user's effort or a manual element such as a spring without a separate external power source. Among the types of rollable display devices, the manual rollable display device, which is operated by the user's effort, uses a link structure, and a gas spring configured to apply a force to the link structure. In this case, the elastic force of the spring disposed in the roller linearly increases or decreases. However, an clastic force of the gas spring non-linearly increases or decreases instead of linearly increasing or decreasing. In case that the force of the gas spring non-linearly increases or decreases as described above, the user needs to excessively apply a force in both the case in which the user intends to wind the display panel and the case in which the user intends to unwind the display panel. Therefore, the user may very inconveniently wind and unwind the display panel. In addition, because the user's excessive force is applied to the display panel, the display panel may be damaged by the user's force. The use of an auxiliary spring may be considered to solve the problem. However, the design of the mechanism becomes complicated, and the number of springs, which perform different functions, is increased, which may make it difficult to design the elastic force of the spring.

Therefore, the display device 100 according to the exemplary aspect of the present disclosure may wind and unwind the display panel 120 by using the plurality of chain units 161 and the driving sprockets 163. In this case, the display device 100 includes the first spring SPR1 disposed in the roller 151, and the second spring SPR2 connected to the driving sprocket 163. In this case, the elastic forces of the first and second springs SPR1 and SPR2 may linearly increase or decrease when the display panel 120 is wound and unwound. Therefore, the balance between the elastic forces of the first and second springs SPR1 and SPR2 is optimized, such that the user may comfortably wind or unwind the display panel 120. In addition, the user may wind or unwind the display panel 120 even with a small effort, thereby minimizing damage to the display device 100.

Figure 11:
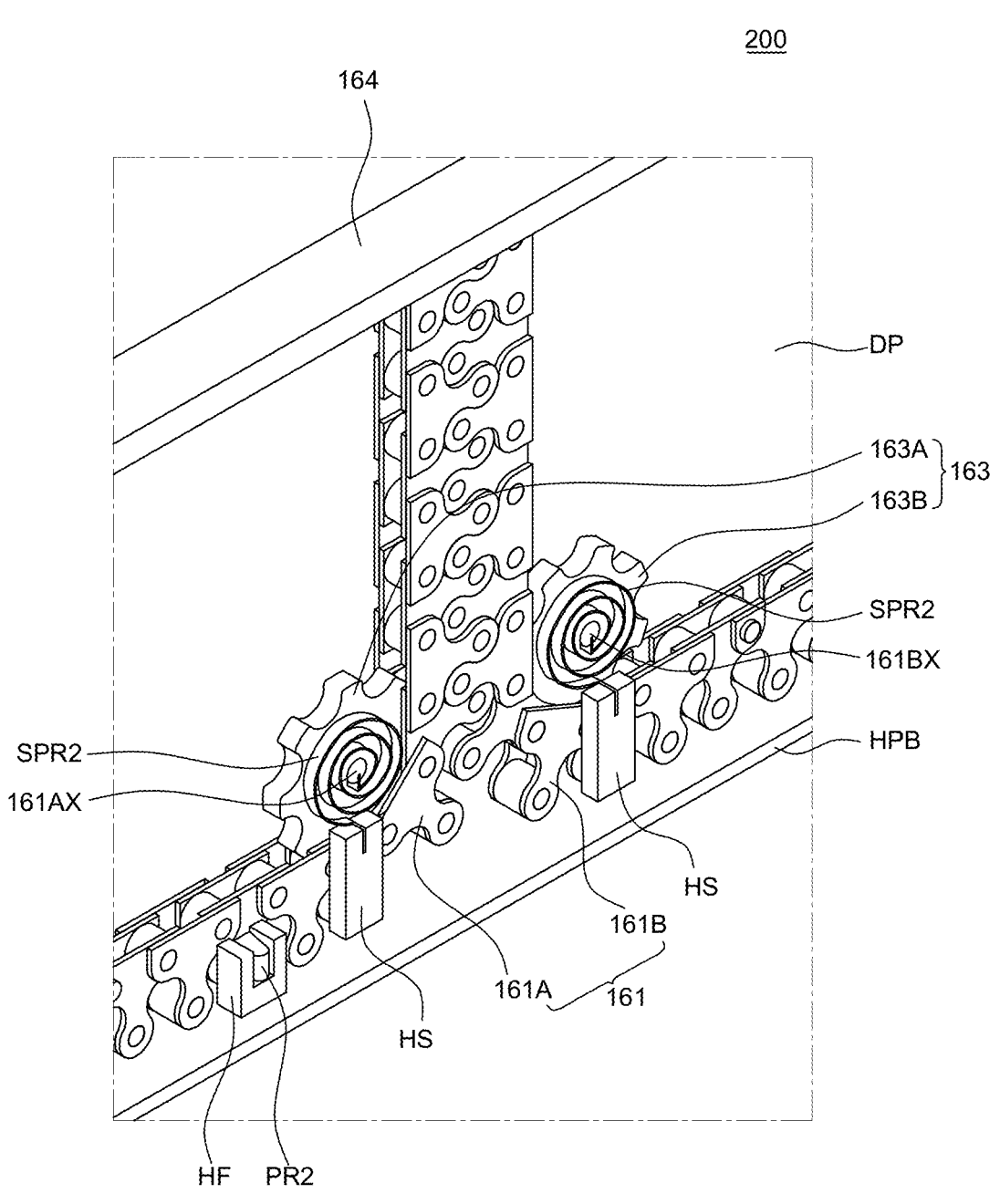
FIG. 11 is a perspective view of a display device according to another exemplary aspect of the present disclosure.

FIG. 11 is a perspective view of a display device according to another exemplary aspect of the present disclosure. A display device 200 in FIG. 11 is substantially identical in configuration to the display device 100 in FIGS. 1 to 11H, except for a protruding portion PR. Therefore, repeated descriptions of the identical components will be omitted.

An unlocking structure may be used to release the state in which the plurality of protruding portions PR is inserted into the fixing part HF. For example, when the user desires to perform unlocking, the user may press the protruding portion PR by using a mechanical unlocking structure, such as a button, or an electrical unlocking structure. In this case, the protruding portion PR is released from the fixing part HF. With reference to FIG. 11, the plurality of protruding portions PR may each have a shape in which a central portion thereof has a largest thickness, and the thickness decreases toward left and right sides thereof. Therefore, in case that the protruding portion PR is pressed, the protruding portion PR may be more easily released from the fixing part HF.

The display device 200 according to another exemplary aspect of the present disclosure may wind and unwind the display panel 120 by using the plurality of chain units 161 and the driving sprockets 163. In this case, the display device 100 includes the first spring SPR1 disposed in the roller 151, and the second spring SPR2 connected to the driving sprocket 163. In this case, the elastic forces of the first and second springs SPR1 and SPR2 may linearly increase or decrease when the display panel 120 is wound and unwound. Therefore, the balance between the clastic forces of the first and second springs SPR1 and SPR2 is optimized, such that the user may comfortably wind or unwind the display panel 120. In addition, the user may wind or unwind the display panel 120 even with a small effort, thereby minimizing damage to the display device 200.

In addition, the protruding portion PR of the display device 200 according to another exemplary aspect of the present disclosure may have a shape in which a central portion thereof has a largest thickness, and the thickness decreases toward left and right sides thereof. Therefore, it is possible to more easily release the protruding portion PR from the fixing part HF with a relatively low force.

The exemplary aspects of the present disclosure may also be described as follows:

According to an aspect of the present disclosure, a display device comprising a display panel, a roller around which the display panel is wound or from which the display panel is unwound, a first spring disposed in the roller, a plurality of chain units connected to the display panel and configured to move the display panel in an upward/downward direction, a plurality of driving sprockets disposed to engage with the plurality of chain units and configured to move the plurality of chain units, and a plurality of second springs connected to the plurality of driving sprockets.

The plurality of chain units comprises a first chain unit, and a second chain unit disposed to face the first chain unit and configured to be coupled to the first chain unit or separated from the first chain unit, the first chain unit and the second chain unit, which are connected to each other, rectilinearly move in the upward/downward direction, and the first chain unit and the second chain unit, which are separated from each other, may rectilinearly move in a leftward/rightward direction.

The plurality of driving sprockets may comprise a first driving sprocket configured to transmit power to the first chain unit, and a second driving sprocket configured to transmit power to the second chain unit.

The display device may further comprise a housing part configured to accommodate the display panel and the roller, the plurality of driving sprockets each comprises a central shaft to which one end of each of the plurality of second springs is fixed, and the housing part may comprise a spring fixing part to which the other end of each of the plurality of second springs is fixed.

The plurality of chain units and the housing part each may comprise a locking structure configured to restrict movements of the plurality of chain units.

The plurality of chain units comprises a plurality of protruding portions, and the housing part may comprise a fixing part configured to fix the plurality of protruding portions.

The plurality of protruding portions may be fixed to the fixing part when one of the plurality of protruding portions is inserted into the fixing part.

The plurality of protruding portions may comprise a first protruding portion configured to be inserted into the fixing part when the display panel is fully wound, and a second protruding portion configured to be inserted into the fixing part when the display panel is fully unwound.

The display device may further comprise an unlocking structure configured to release a state in which the plurality of protruding portions is inserted into the fixing part.

The plurality of protruding portions may be configured to be accommodated in the plurality of chain units.

The plurality of protruding portions each may have a shape in which a central portion thereof has a largest thickness, and the thickness decreases toward left and right sides thereof.

The first spring transmits a force to the roller in a direction in which the display panel is wound around the roller, and the second spring may transmit a force to the roller in a direction in which the display panel is unwound from the roller.

An elastic force of the first spring may be maximized in a state in which the display panel is fully unwound from the roller and minimized in a state in which the display panel is fully wound around the roller.

An elastic force of the second spring may be minimized in a state in which the display panel is fully unwound from the roller and maximized in a state in which the display panel is fully wound around the roller.

An elastic force of the first spring and an elastic force of the second spring linearly may increase or decrease as the roller rotates.

The first spring and the second spring may be each a spiral spring or a torsion spring.

The roller may be configured to be rotated by elastic forces of the first spring and the second spring and a user's effort.

When the display panel is unlocked in a fully wound state, the roller may be rotated by the elastic force of the second spring.

When the display panel is unlocked in the fully wound state, the display panel may be unwound until the elastic force of the second spring and the elastic force of the first spring are equilibrated.

When the display panel is unlocked in a fully unwound state, the roller may be rotated by the elastic force of the first spring.

When the display panel is unlocked in the fully unwound state, the display panel may be wound until the elastic force of the first spring and the elastic force of the second spring are equilibrated.

The display panel may be configured to be wound or unwound by the user's effort in a state in which the elastic force of the first spring and the elastic force of the second spring are equilibrated.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display device comprising:
a display panel;
a roller disposed around which the display panel is wound or from which the display panel is unwound;
a first spring disposed in the roller;

a plurality of chain units connected to the display panel and configured to move the display panel in an upward/downward direction;

a plurality of driving sprockets disposed to engage with the plurality of chain units and configured to move the plurality of chain units;

a plurality of second springs connected to the plurality of driving sprockets; and a housing part configured to accommodate the display panel and the roller, wherein the plurality of driving sprockets each comprises a central shaft to which one end of each of the plurality of second springs is fixed, and wherein the housing part comprises a spring fixing part to which the other end of each of the plurality of second springs is fixed.

2. The display device of claim 1, wherein the plurality of chain units comprises:

a first chain unit; and a second chain unit disposed to face the first chain unit and configured to be coupled to the first chain unit or separated from the first chain unit, wherein the first chain unit and the second chain unit, which are connected to each other, rectilinearly move in the upward/downward direction, and wherein the first chain unit and the second chain unit, which are separated from each other, rectilinearly move in a leftward/rightward direction.

3. The display device of claim 2, wherein the plurality of driving sprockets comprises:

a first driving sprocket configured to transmit power to the first chain unit; and a second driving sprocket configured to transmit power to the second chain unit.

4. The display device of claim 1, wherein the plurality of chain units and the housing part each comprise a locking structure configured to restrict movements of the plurality of chain units.

5. The display device of claim 4, wherein the plurality of chain units comprises a plurality of protruding portions, and the housing part comprises a fixing part configured to fix the plurality of protruding portions.

6. The display device of claim 5, wherein the plurality of protruding portions is fixed to the fixing part when one of the plurality of protruding portions is inserted into the fixing part.

7. The display device of claim 6, wherein the plurality of protruding portions comprises:

a first protruding portion configured to be inserted into the fixing part when the display panel is fully wound; and a second protruding portion configured to be inserted into the fixing part when the display panel is fully unwound.

8. The display device of claim 7, further comprising an unlocking structure configured to release a state in which the plurality of protruding portions is inserted into the fixing part.

9. The display device of claim 5, wherein the plurality of protruding portions is configured to be accommodated in the plurality of chain units.

10. The display device of claim 5, wherein the plurality of protruding portions each has a shape in which a central portion thereof has a largest thickness, and the thickness decreases toward left and right sides thereof.

11. The display device of claim 1, wherein the first spring transmits a force to the roller in a direction in which the display panel is wound around the roller, and the second spring transmits a force to the roller in a direction in which the display panel is unwound from the roller.

12. The display device of claim 1, wherein an elastic force of the first spring is maximized in a state in which the display panel is fully unwound from the roller and minimized in a state in which the display panel is fully wound around the roller.

13. The display device of claim 1, wherein an elastic force of the second spring is minimized in a state in which the display panel is fully unwound from the roller and maximized in a state in which the display panel is fully wound around the roller.

14. The display device of claim 1, wherein an elastic force of the first spring and an elastic force of the second spring linearly increases or decreases as the roller rotates.

15. The display device of claim 1, wherein the first spring and the second spring are each a spiral spring or a torsion spring.

16. The display device of claim 1, wherein the roller is configured to be rotated by elastic forces of the first spring and the second spring and a user's effort.

17. The display device of claim 16, wherein when the display panel is unlocked in a fully wound state, the roller is rotated by the elastic force of the second spring.

18. The display device of claim 17, wherein when the display panel is unlocked in the fully wound state, the display panel is unwound until the elastic force of the second spring and the elastic force of the first spring are equilibrated.

19. The display device of claim 16, wherein when the display panel is unlocked in a fully unwound state, the roller is rotated by the elastic force of the first spring.

20. The display device of claim 19, wherein when the display panel is unlocked in the fully unwound state, the display panel is wound until the elastic force of the first spring and the elastic force of the second spring are equilibrated.

21. The display device of claim 16, wherein the display panel is configured to be wound or unwound by the user's effort in a state in which the elastic force of the first spring and the elastic force of the second spring are equilibrated.

* * * * *